United States Patent [19]
Anantha et al.

[11] 4,117,546
[45] Sep. 26, 1978

[54] INTERLACED CCD MEMORY

[75] Inventors: Narasipur Gundappa Anantha, Hopewell Junction; Moises Cases, Fishkill; Fung Yuel Chang; Barry Jay Rubin, both of Wappingers Falls, all of N.Y.

[73] Assignee: International Business Machines Corporation, Armonk, N.Y.

[21] Appl. No.: 865,806

[22] Filed: Dec. 30, 1977

[51] Int. Cl.$^2$ ............................................. G11C 11/40
[52] U.S. Cl. ........................................ 365/233; 365/183; 307/238
[58] Field of Search ................. 365/233, 230, 183; 307/238

[56] References Cited
U.S. PATENT DOCUMENTS
3,763,480  8/1973  Weimer .............................. 365/233

*Primary Examiner*—Terrell W. Fears
*Attorney, Agent, or Firm*—Theodore E. Galanthay

[57] ABSTRACT

Disclosed is an interlaced serial-parallel-serial (SPS) charge coupled device (CCD) memory with improved clocking. By performing the interlacing as well as the serial-parallel-serial function with only seven clock pulses, less metallurgy and consequently less space per bit on a semiconductor chip is required. By reducing the number of clock requirements, the supporting logic circuitry is simplified permitting a larger portion of the semiconductor chip area to be used for data bit storage.

12 Claims, 39 Drawing Figures

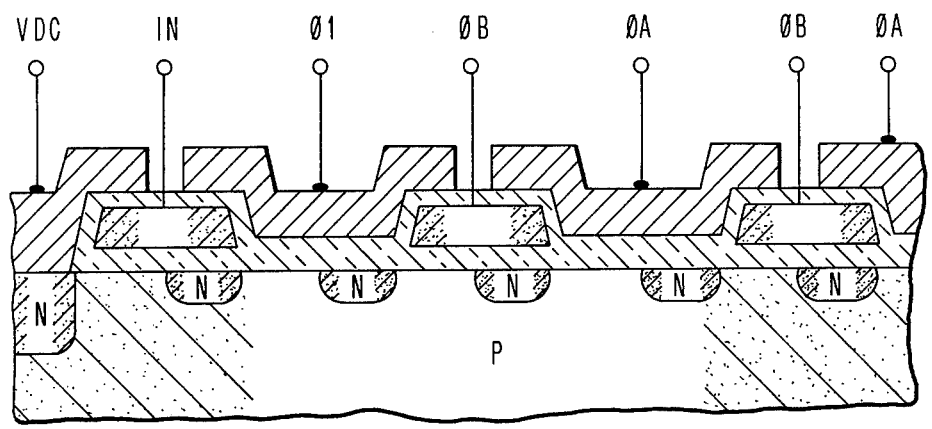
FIG. 6
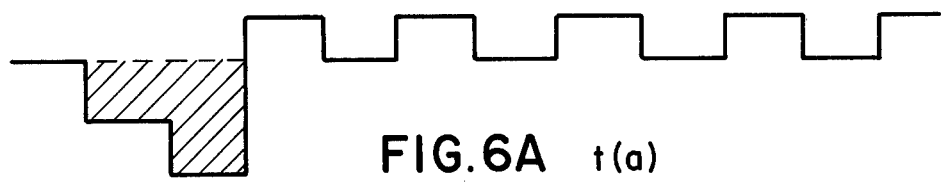
FIG. 6A  t(a)
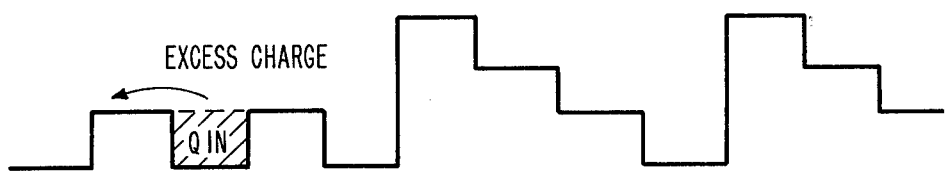
FIG. 6B  t(b)
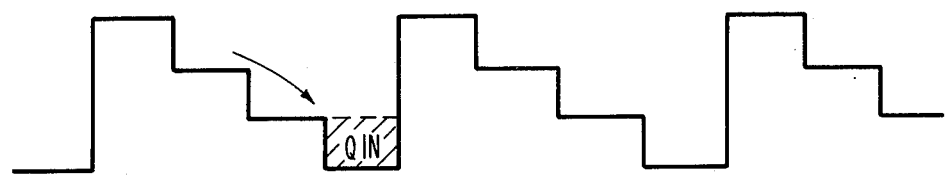
FIG. 6C  t(c)

INTERLACED CCD MEMORY

BACKGROUND OF THE INVENTION

1. Field of the Invention

This invetnion relates generally to interlaced SPS CCD memories and more particularly to an improved configuration requiring only seven clock pulses.

2. Description of the Prior Art

Charge coupled device (CCD) memories for use in data processing system storage are well known in the art. The original Boyle and Smith concept (See Boyle et al., U.S. Pat. No. 3,858,232) appeared in the Bell System Technical Journal in April, 1970, Pages 587–593. Numerous subsequent publications and patents include an article entitled; "Charge Coupled Devices and Application", Solid State Technology, April, 1974, Pages 67–77 by J. E. Carnes and W. F. Kosonocky. The technical and patent literature describes various improvments to the original concepts and these teachings including the aforementioned published and patent literature are incorporated herein by reference.

In the field of high density and low power dissipation CCD's, a serial-parallel-serial (SPS) structure was described in Weimer, U.S. Pat. No. 3,763,480. In an SPS configuration, a data bit stream is injected into a serial CCD shift register from where it is transferred in parallel to a parallel storage register. The data can then be shifted in parallel through the parallel register, transferred in parallel to an output serial register, from where it is shifted out as a serial bit stream.

The foregoing SPS configuration had density constraints occasioned by the need for CCD's to have both transfer and storage sites. For example, assuming a two phase shift register, the storage of one bit of information requires not only a storage site but also a transfer site so that bits are actually stored in only one-half of the available sites. Assuming a two-phase serial CCD with eight sites, only four bits can be stored. When transferring from a serial to a parallel configuration, the channel width was made twice the required width so that only one-half of the potentially available storage sites in the parallel register could be utilized.

Density could be significantly improved by an interlaced serial-parallel-serial configuration. In an interlaced structure, all eight serial bits can be transferred in parallel through the parallel section, at least theoretically doubling the number of bits that can be stored in the parallel section. Such interlaced SPS configurations are described in Elmer et al., U.S. Pat. No. 4,007,446, as well as in U.S. Pat. Nos. 3,913,077, and 3,967,254. These three patents teach various clocking techniques and input/output register structures. The described techniques address various problems related to the advantageous implementation of an interlaced SPS CCD configuration.

A problem that remains unsolved by the aforementioned three patents is a requirement for an excessive number of clocks. For example, it would appear that U.S. Pat. No. 3,913,077 requires 10 clocks, U.S. Pat. No. 3,967,254 requires 13 clocks, and U.S. Pat. No. 4,007,446 requires not only 24 clocks, but additional buffer rows such as row 00 and row 34 for SPS buffering. On a semiconductor chip, every clock must be distributed to selected devices by conductors which, of necessity, occupy space on the semiconductor chip. These added conductors, usually formed by highly doped polycrystalline silicon and/or metallurgy, decrease the bit per unit area density of the CCD storage. Furthermore, the generation and processing of each clock pulse usually requires additional support circuitry which occupies semiconductor chip area further taking away from the space that is available for data bit storage.

SUMMARY OF THE INVENTION

Accordingly, it is an object of this invention to minimize the number of clocks required for the operation of an interlaced SPS CCD memory;

It is a further object of this invention to improve the bit storage density of an interlaced SPS CCD memory on an integrated circuit chip;

Lastly, it is an object of this invention to simplify the support circuitry structure and the semiconductor chip layout for an interlaced SPS CCD memory.

In accordance with the foregoing, we provide a two phase interlaced SPS CCD memory requiring only seven clocks. The necessary CCD storage and transfer functions are performed with these seven clocks by the advantageous timing and pulse width relationships to be described herein. Transfer and storage through the parallel section requires only two clocks while the input and output clocking in which a continuous and uninterrupted bit stream is converted from serial to parallel to serial configuration without the use of a buffer stage requires only five clocks.

Briefly, a serial input stage having M storage cells (including M/2 storage sites and M/2 transfer sites) and adapted to receive a serial bit stream at a first one of said M storage cells is provided. A first clock pulse connected to this first storage cell permits the transfer of bits from the serial bit stream into and out of the first storage site. Second and third clock pulses are also connected to the serial input stage and serially transfer data bits to alternate ones of the M storage cells until M/2 data bits are stored in the serial input stage at alternate storage cells. At this point in time, the serial input stage is "full" even though only every alternate storage cell has a data bit therein because it is necessary to have both a storage site and a transfer site available for each bit.

When the serial input stage is "full", the M/2 data bits are transferred in parallel to the parallel storage array which has M rows and X columns. As soon as the M/2 data bits have been transferred from the serial input stage into the first column of the parallel storage array, an additional M/2 data bits are serially transferred into the serial input stage under the control of the first, second and third clock pulses to those M/2 storage cells which previously did not contain data bits. These last M/2 data bits are then transferred from the serial input stage to the first column of the parallel storage array so that all M storage positions of the first column of the parallel storage array contain a data bit at which point in time all M data bits are transferred in parallel through the parallel storage array under the control of the fourth and fifth clock pulses.

It should here be noted that each column in the parallel array includes first and second stages, i.e. a transfer stage and a storage stage. In order to accomplish the just described serial register to parallel array transfer, the M/2 bits in the serial input stage are transferred to a first stage in the first column in the parallel storage array in response to simultaneous pulses of the same polarity provided by the first ($\emptyset1$), second ($\emptyset A$), third ($\emptyset B$) and fourth ($\emptyset1'$) clocks, with an opposite polarity of the fifth (∅2') clock providing a potential well. The first set of M/2 bits are then transferred to the second stage of the first column of the parallel array in response to the fourth clock providing a potential well by an opposite polarity signal while the fifth clock pulse changes polarity to push the M/2 bits in parallel into the second stage of the first column, while the first clock conditions the first storage cell in the serial input stage to accept the next bit from the serial bit stream. The first M/2 bits are held in the second stage of the first column of the parallel storage array until the second set of M/2 data bits are transferred into the same second stage of the parallel storage array at which time, all M bits can then be transferred in parallel through the parallel storage array.

When the first set of M bits has been shifted to the second stage of the Xth column, the first M/2 bits are transferred into an output serial register partly under the control of a sixth (∅C) clock pulse in conjunction with the aforementioned first clock pulse. These M/2 bits are then transferred out serially from the output serial stage by means of the first clock pulse and a seventh (∅2) clock pulse. As soon as the serial output stage is empty, the second set of M/2 data bits can be transferred into the serial output stage under the control of the fourth and seventh clock pulses for serial transfer out.

The foregoing and other objects, features, and advantages of the invention will be apparent from the following and more particular description of preferred embodiments of the invention, as illustrated in the accompanying drawings.

IN THE DRAWINGS

Figure 5:
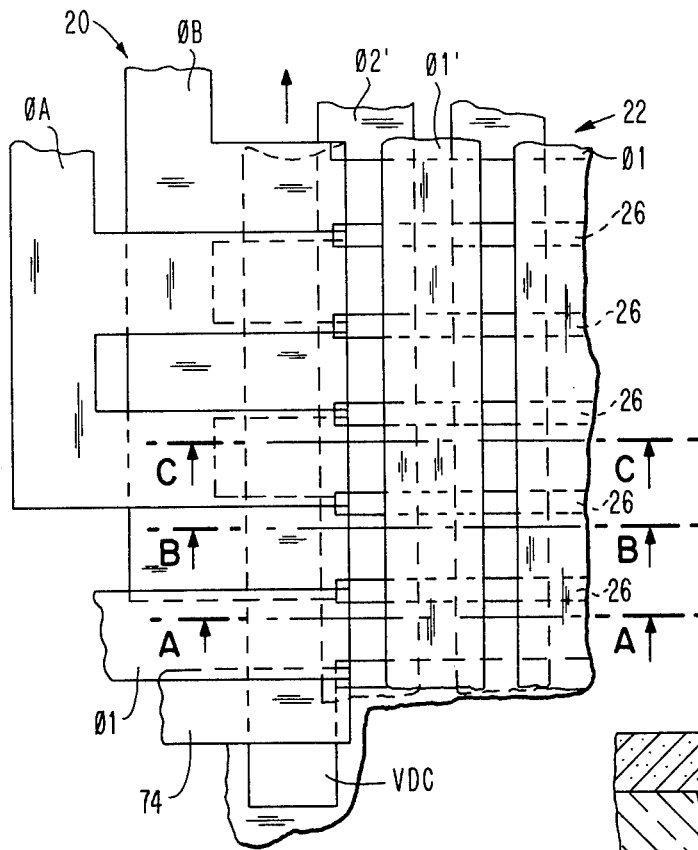
FIG. 5 is a top view of a semiconductor chip layout of a portion of the CCD memory including the input storage cell.
Figure 5B:
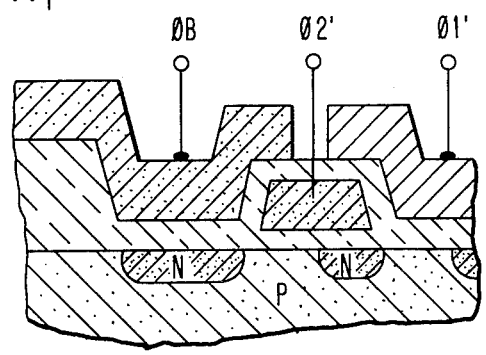
Figure 5A:
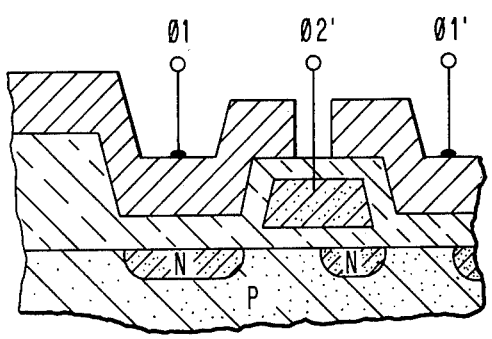
Figure 5C:
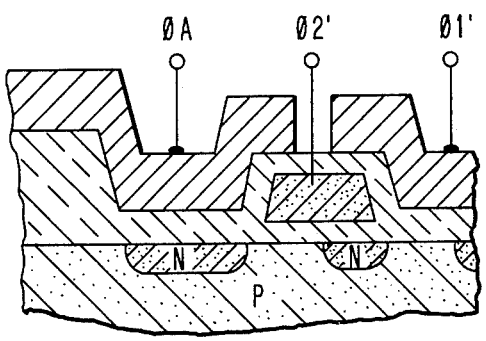

FIGS. 5A, 5B, and 5C are vertical sections of a portion of the semiconductor chip illustrated in FIG. 5.

FIG. 6 is a semiconductor cross section.

Figure 6G:
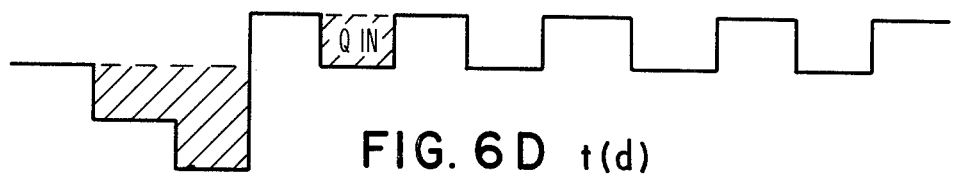
Figure 6G:
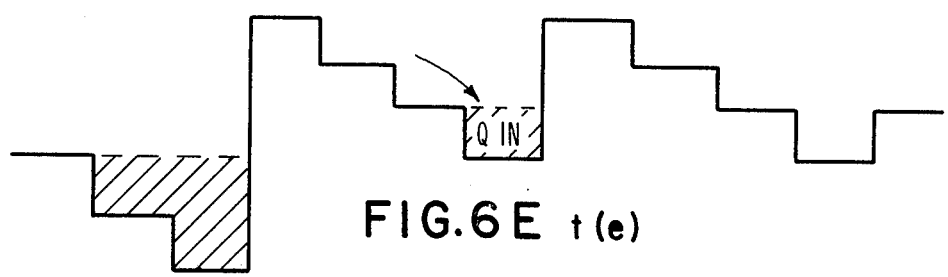
Figure 6G:
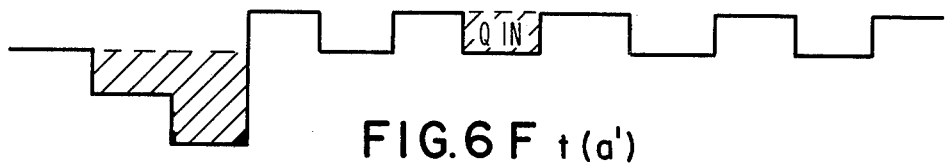
Figure 6G:
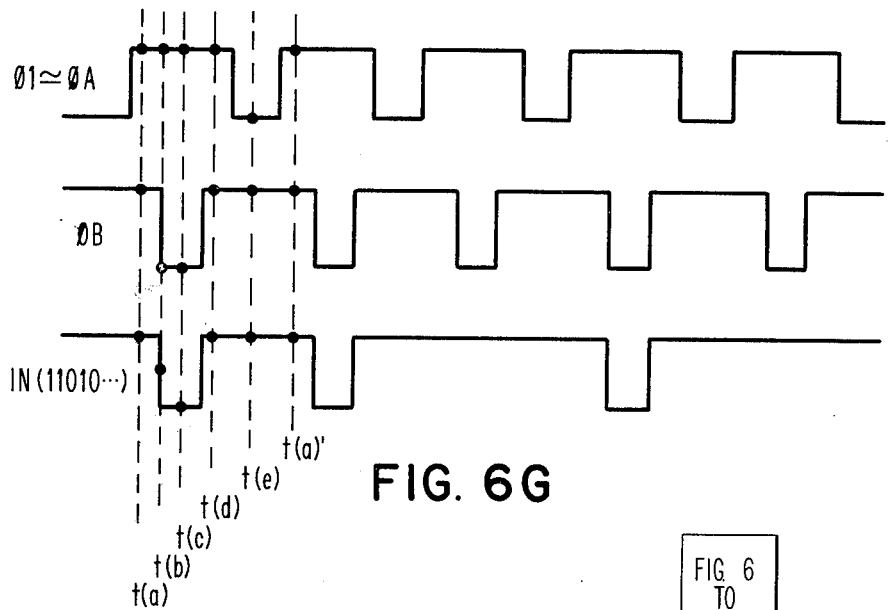

FIGS. 6A through 6F are the potential profile diagrams depicting charge transfer through potential wells, and FIG. 6G shows the voltage waveforms.

Figure 6H:
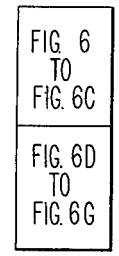

FIG. 6H is a composite diagram illustrating the relationship of FIGS. 6 through 6G.

Figure 7:
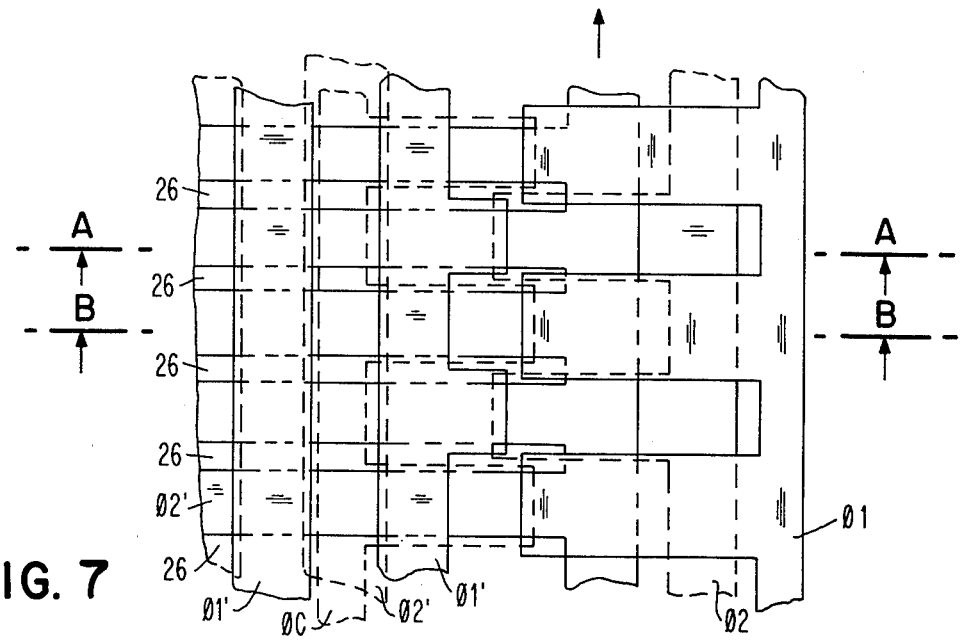

FIG. 7 is a top view of the semiconductor chip including a portion of the output stage.

Figure 7A:
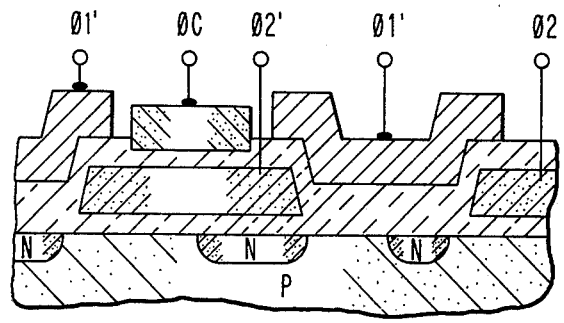
Figure 7B:
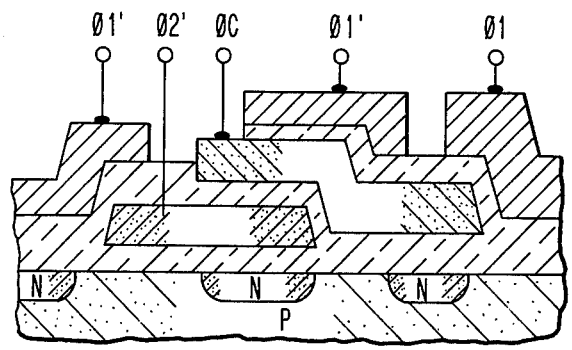

FIGS. 7A and 7B are vertical sections of a portion of the semiconductor chip illustrated in FIG. 7.

Figure 8A:
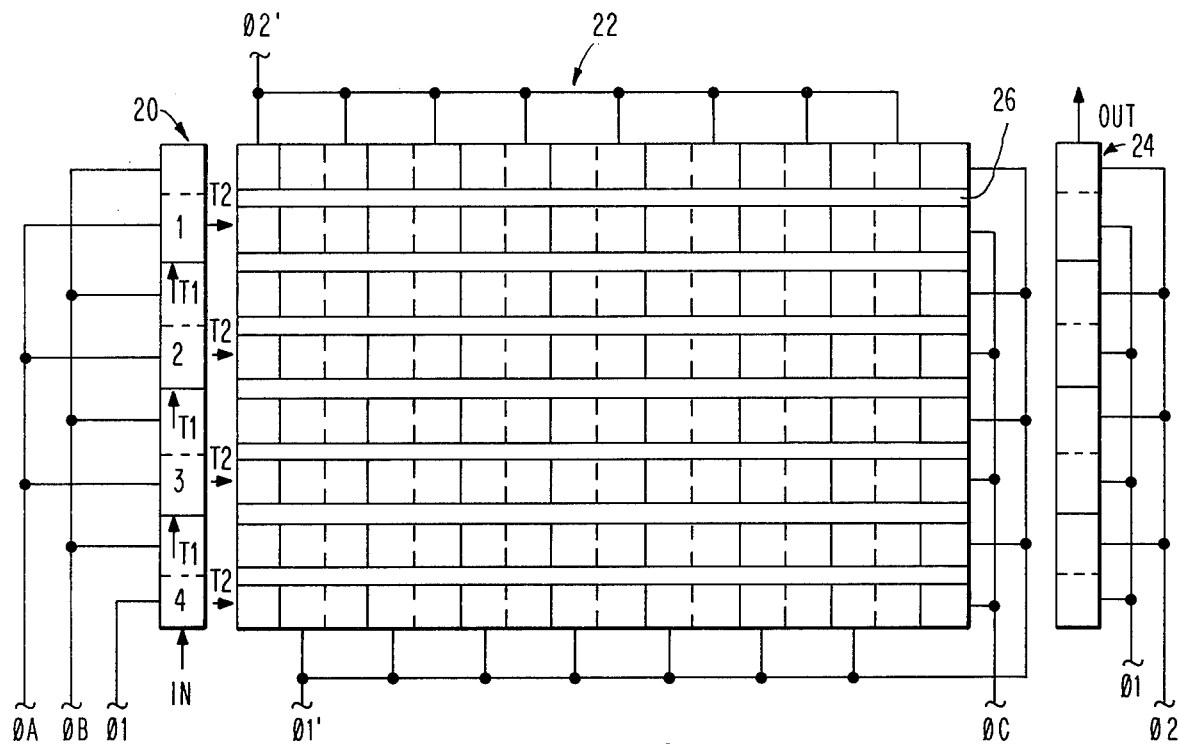
Figure 8B:
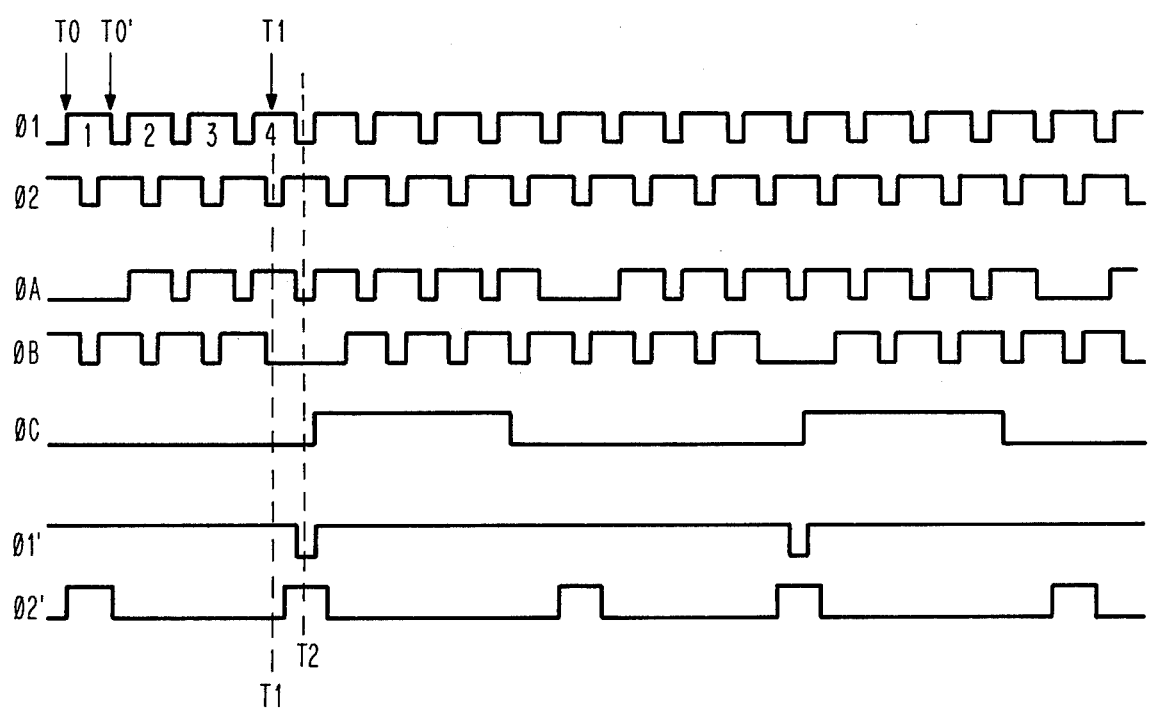

FIGS. 8A and 8B illustrate the insertion of the first M/2 bits into the input serial register.

Figure 9A:
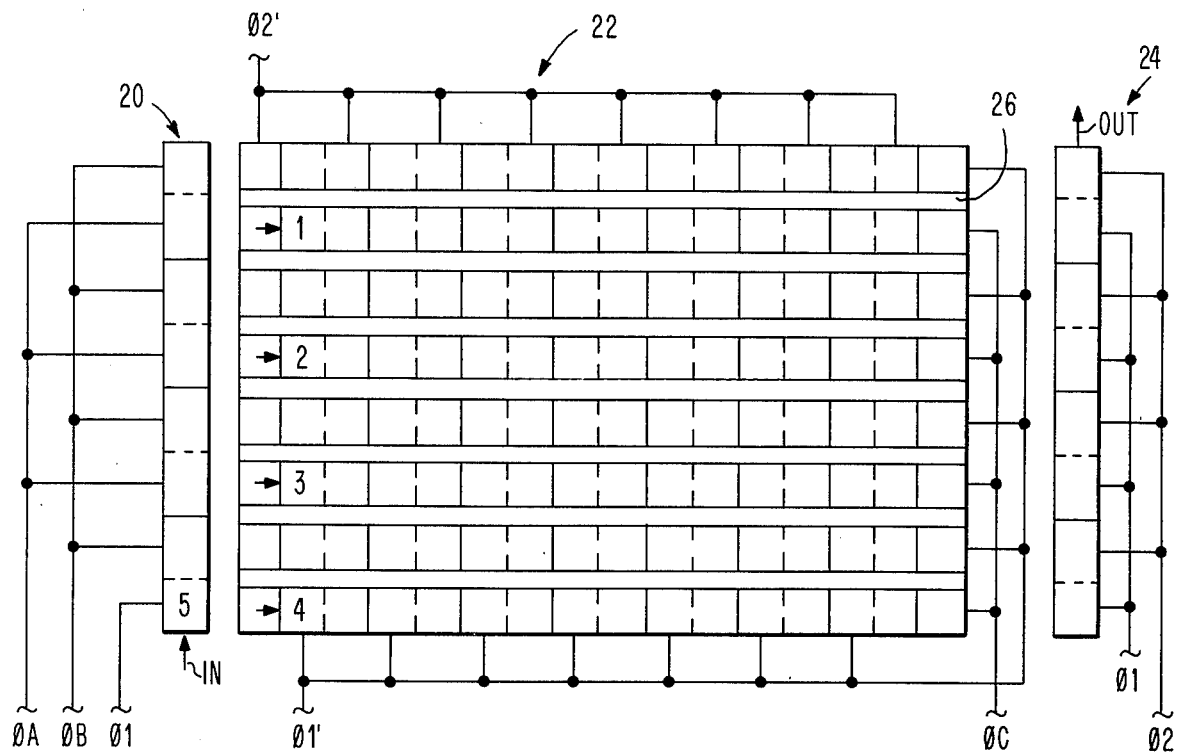
Figure 9B:
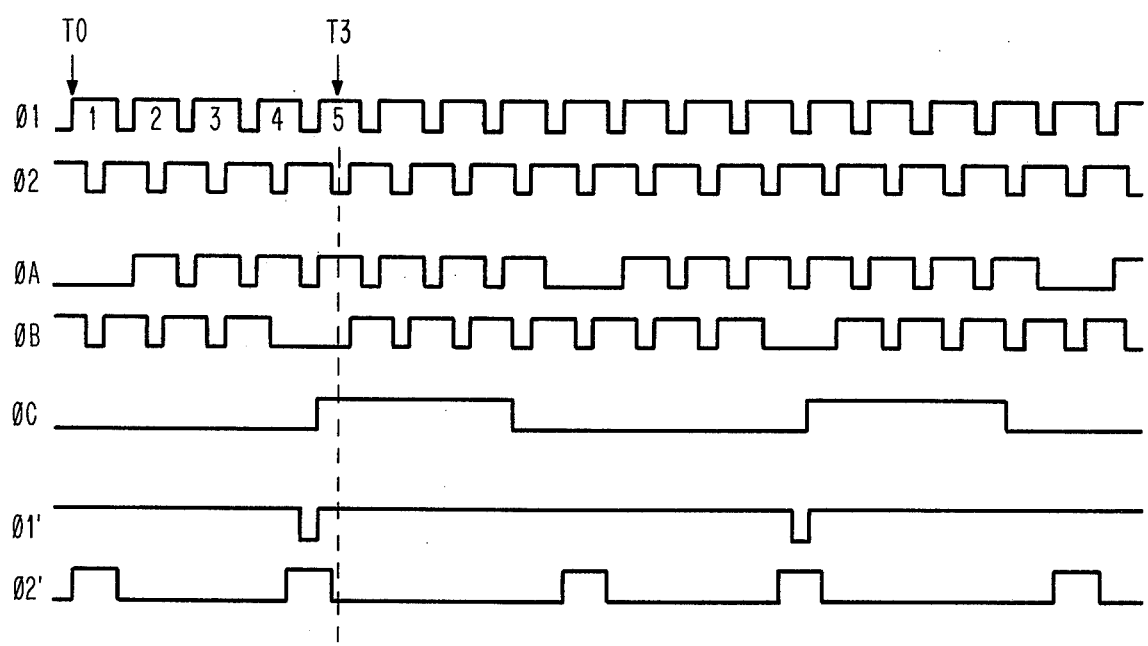

FIGS. 9A and 9B illustrate the transfer of the first M/2 bits into the second stage of the first column of the parallel array while the next succeeding bit is brought into the first storage cell of the serial input stage.

Figure 10A:
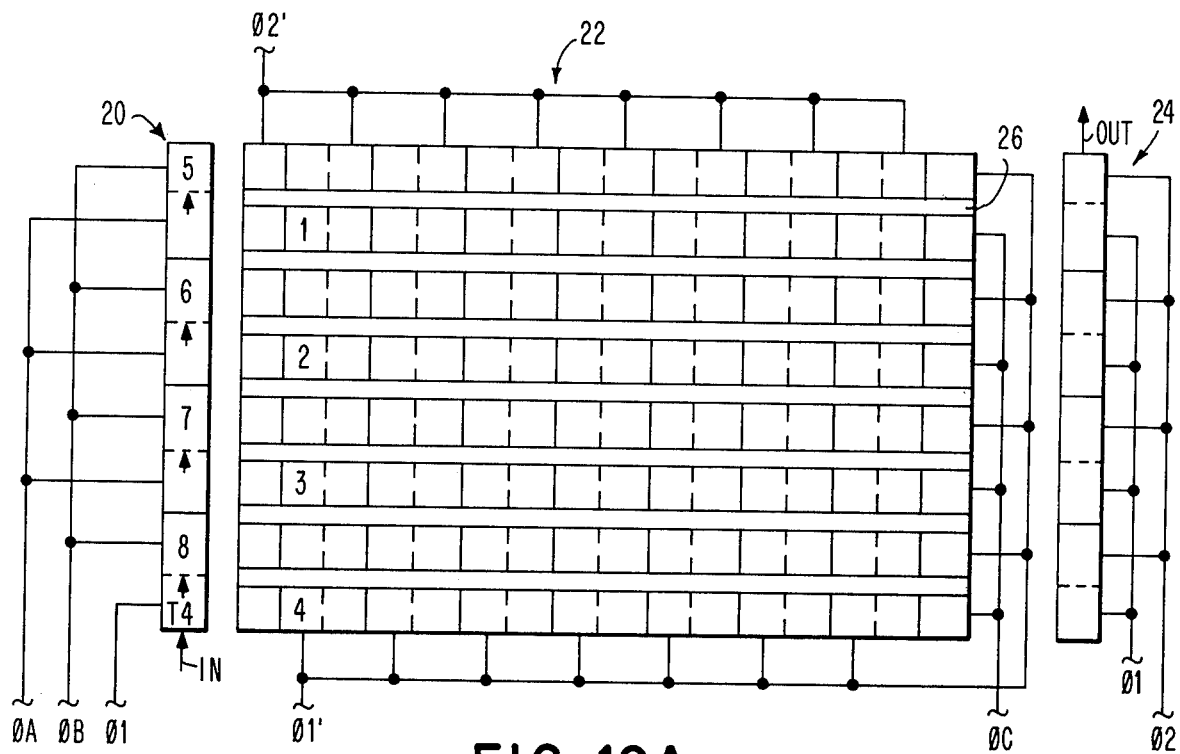
Figure 10B:
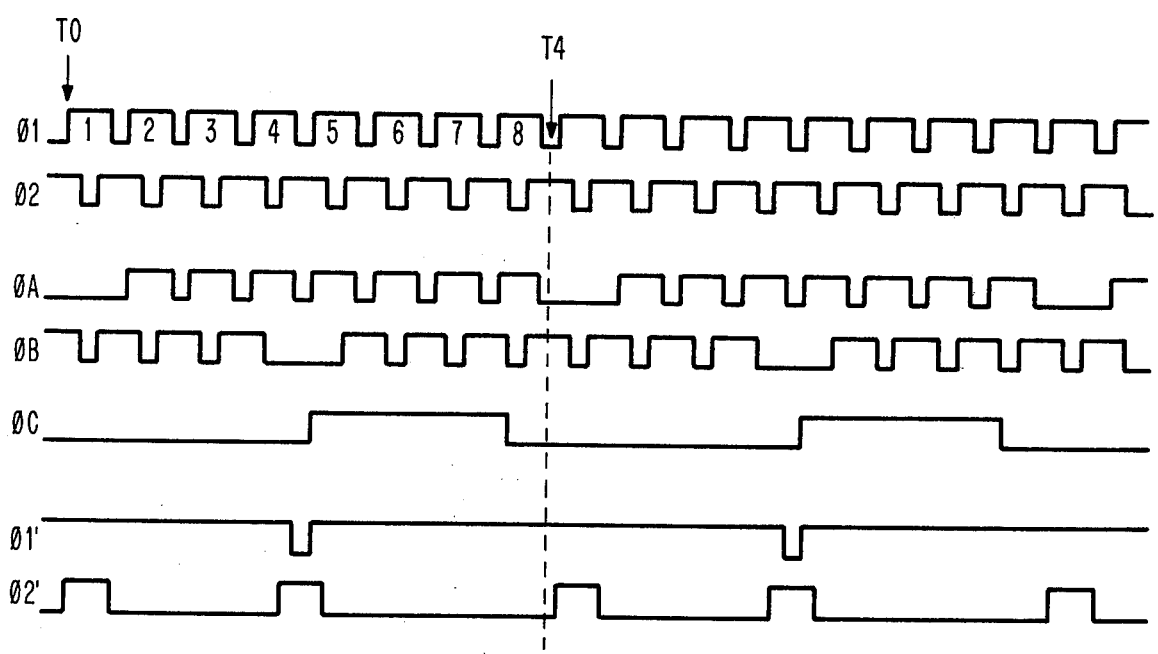

FIGS. 10A and 10B illustrate the end of the M bit write cycle.

Figure 11A:
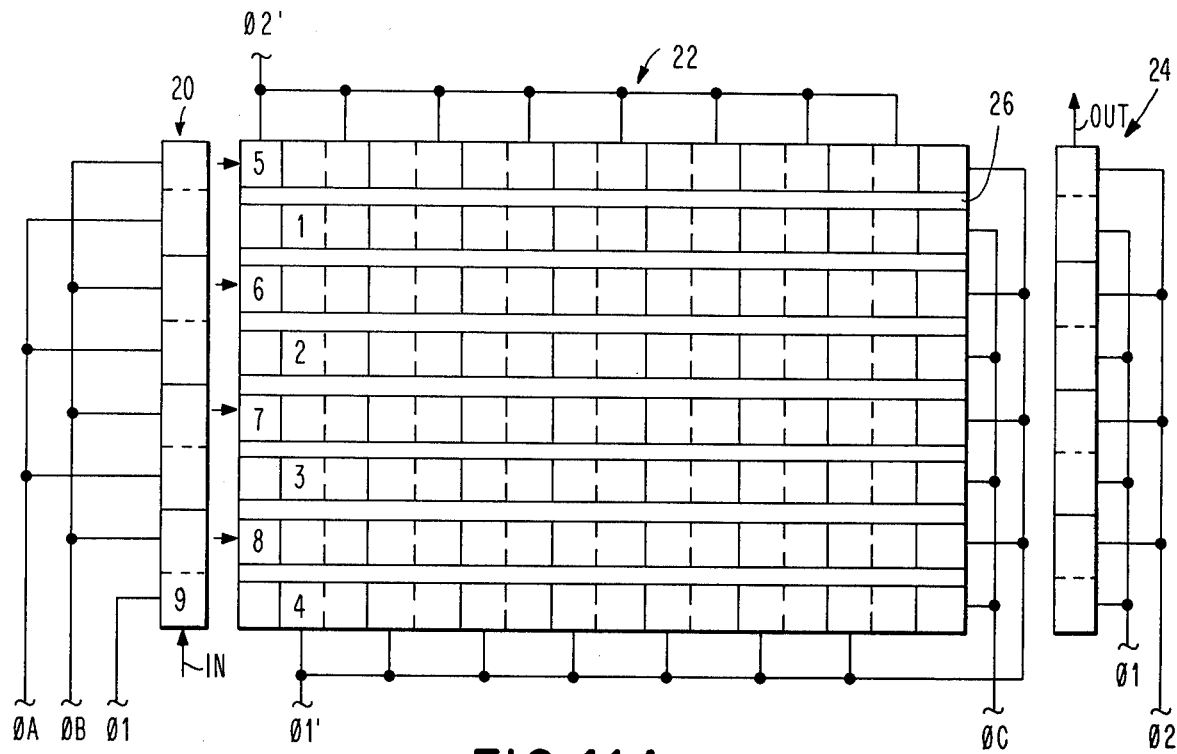
Figure 11B:
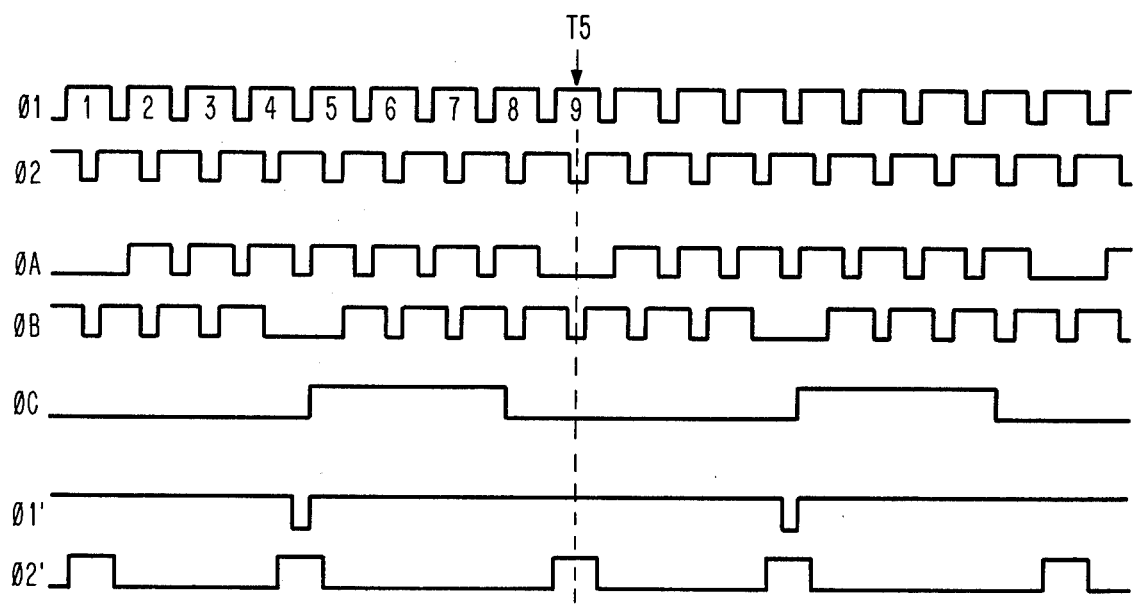

FIGS. 11A and 11B illustrate the start of the second M bit write cycle.

Figure 12:
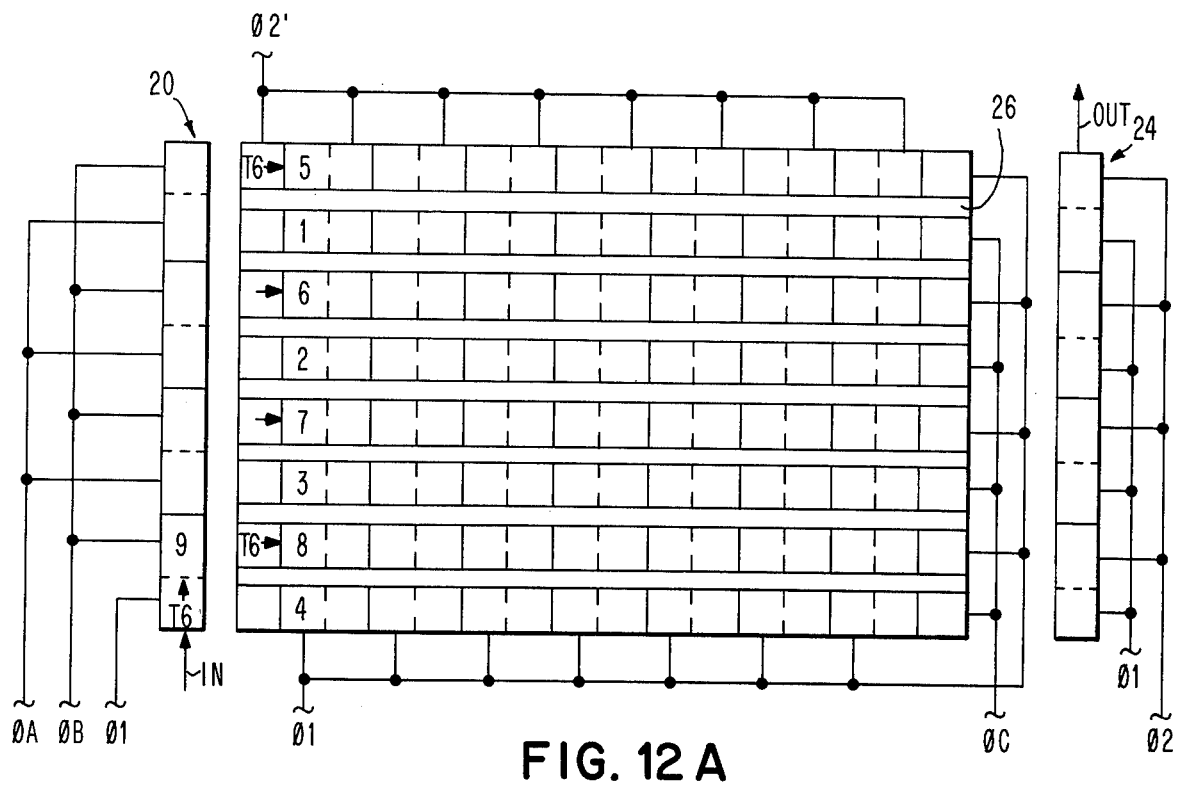
Figure 12:
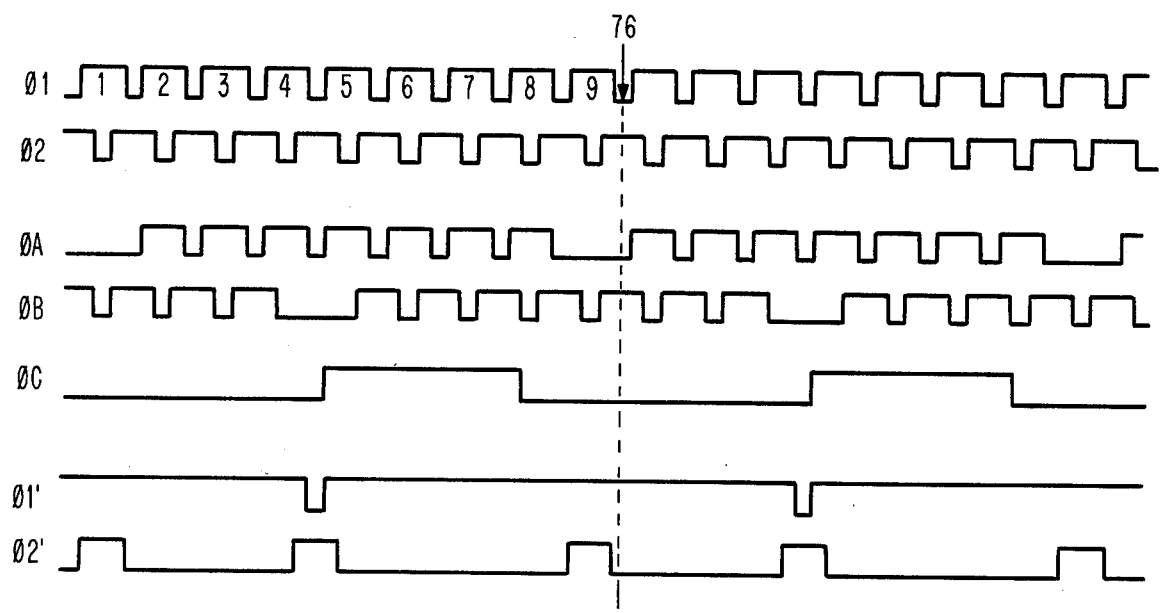

FIGS. 12A and 12B illustrate all of the first M bits in the second stage of the first column of the parallel storage array.

Figure 13A:
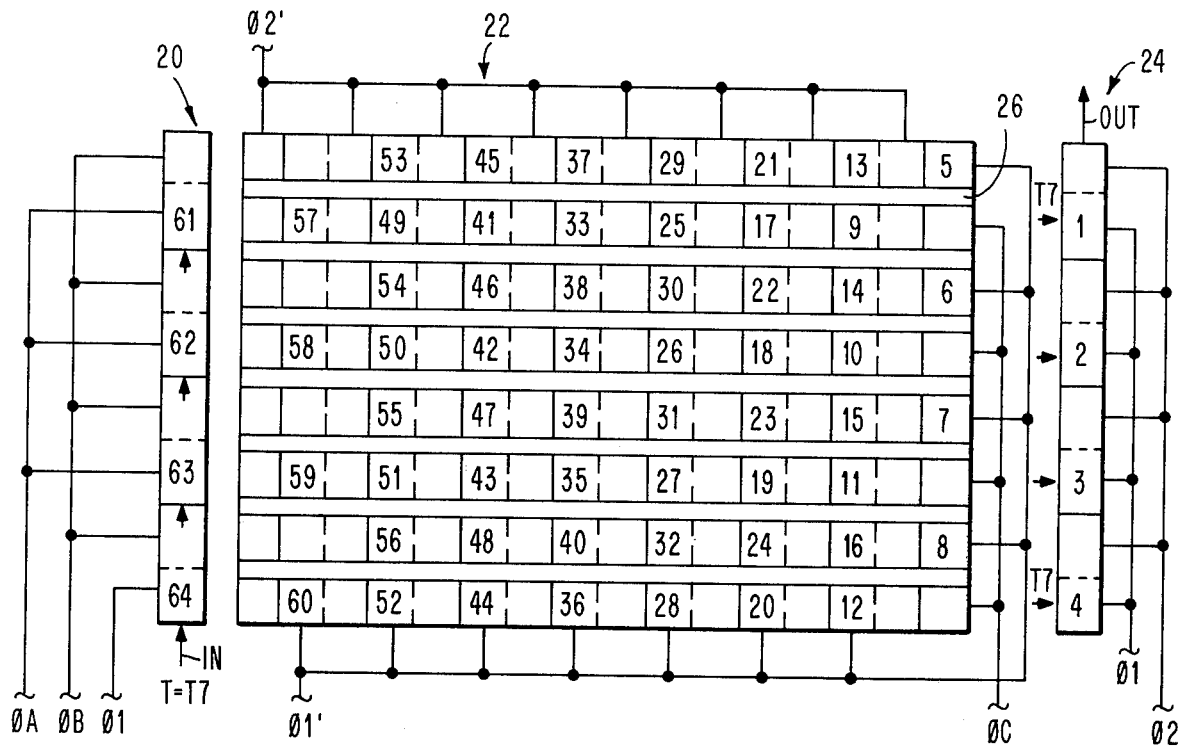
Figure 13B:
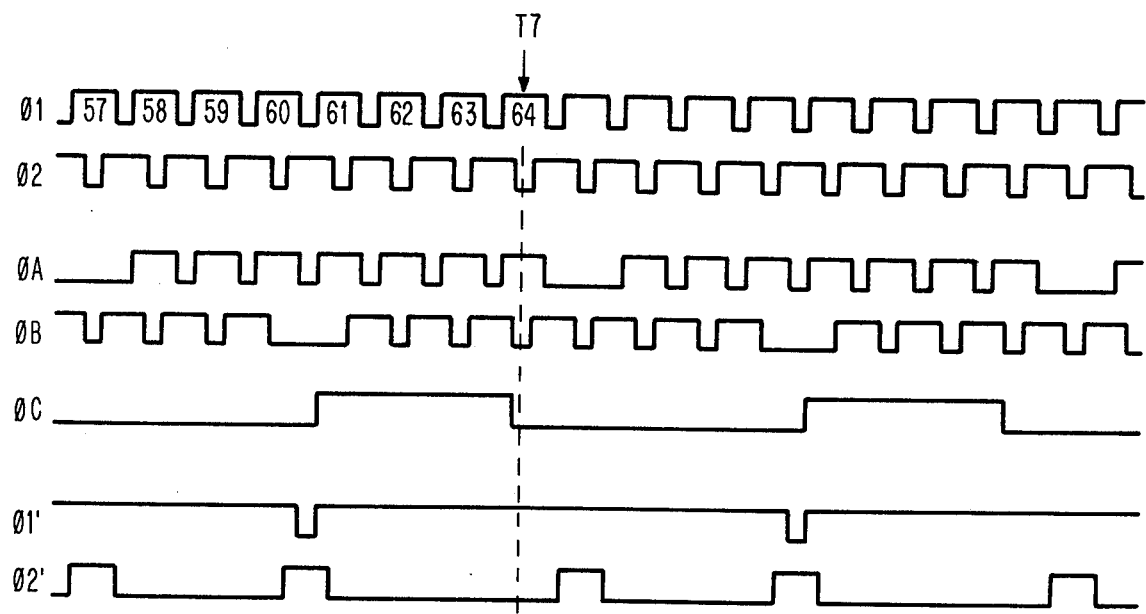

FIGS. 13A and 13B illustrate the transfer of the first M/2 bits from the parallel array into the serial output register.

Figure 14A:
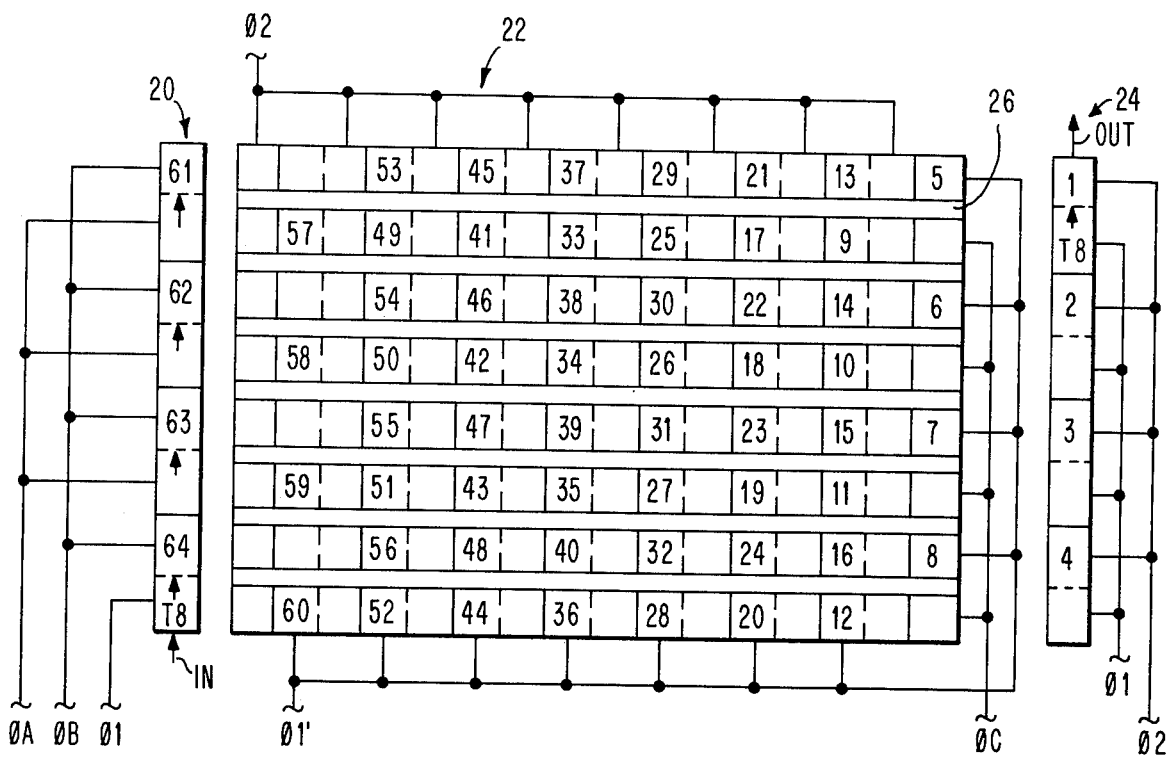
Figure 14B:
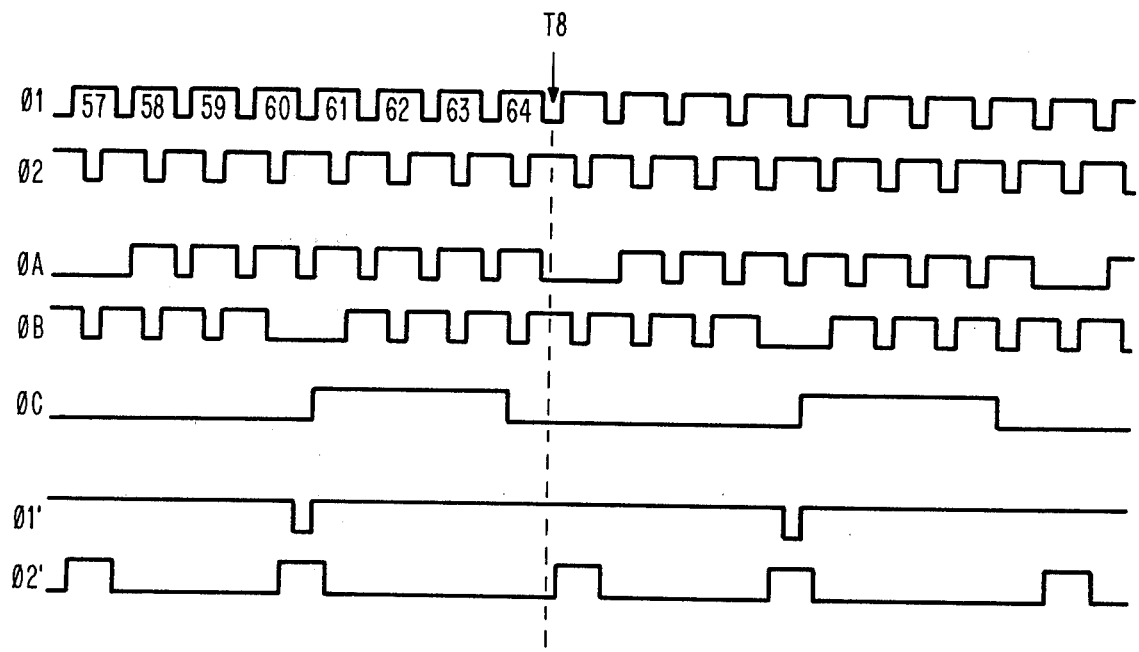

FIGS. 14A and 14B illustrate the end of the write cycle for the storage of all 64 bits in the 8 × 8 bit exemplary interlaced SPS CCD memory.

Figure 15A:
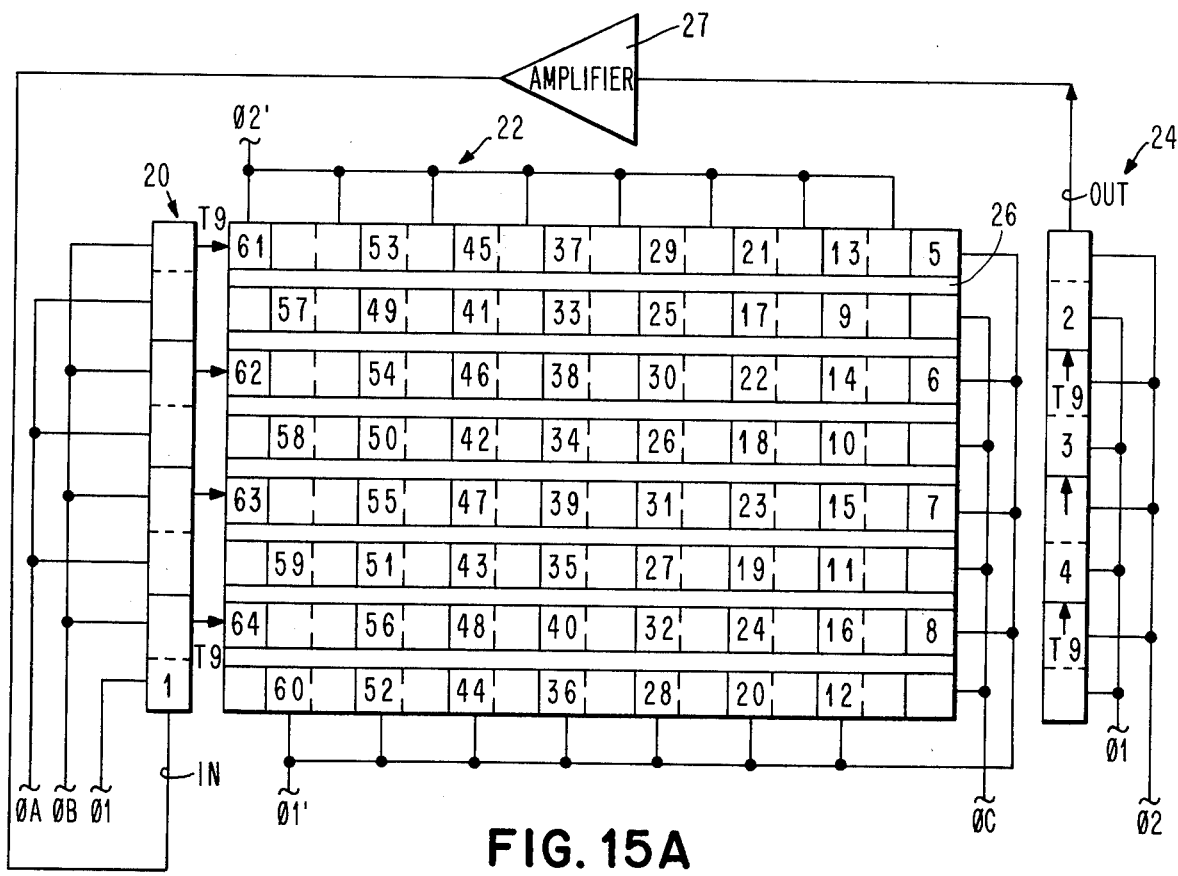
Figure 15B:
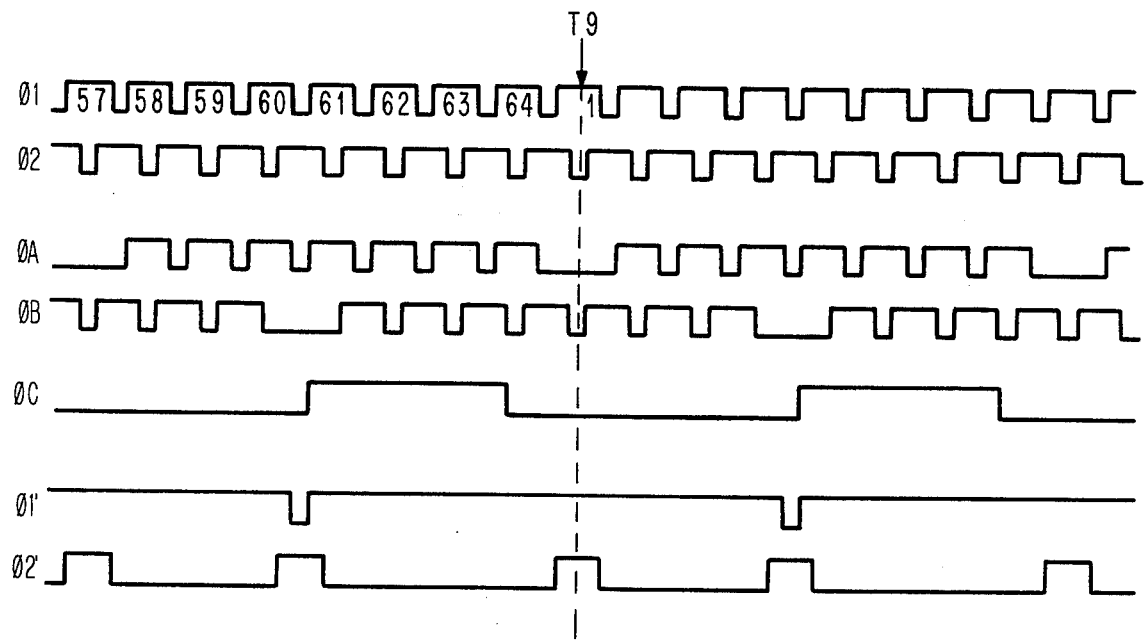

FIGS. 15A and 15B illustrate the beginning of the recirculation/regeneration operation.

Figure 16A:
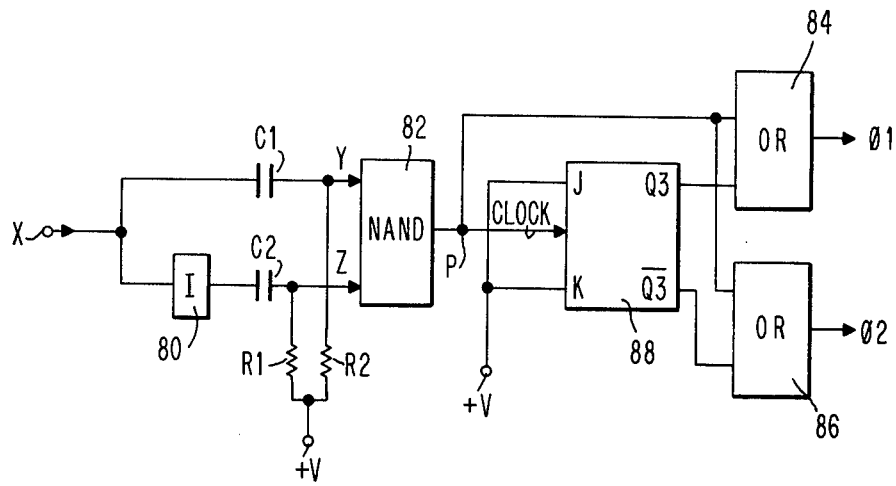

FIG. 16A is a logic circuit diagram for the generation of the phase 1 and phase 2 clock pulses.

Figure 16B:
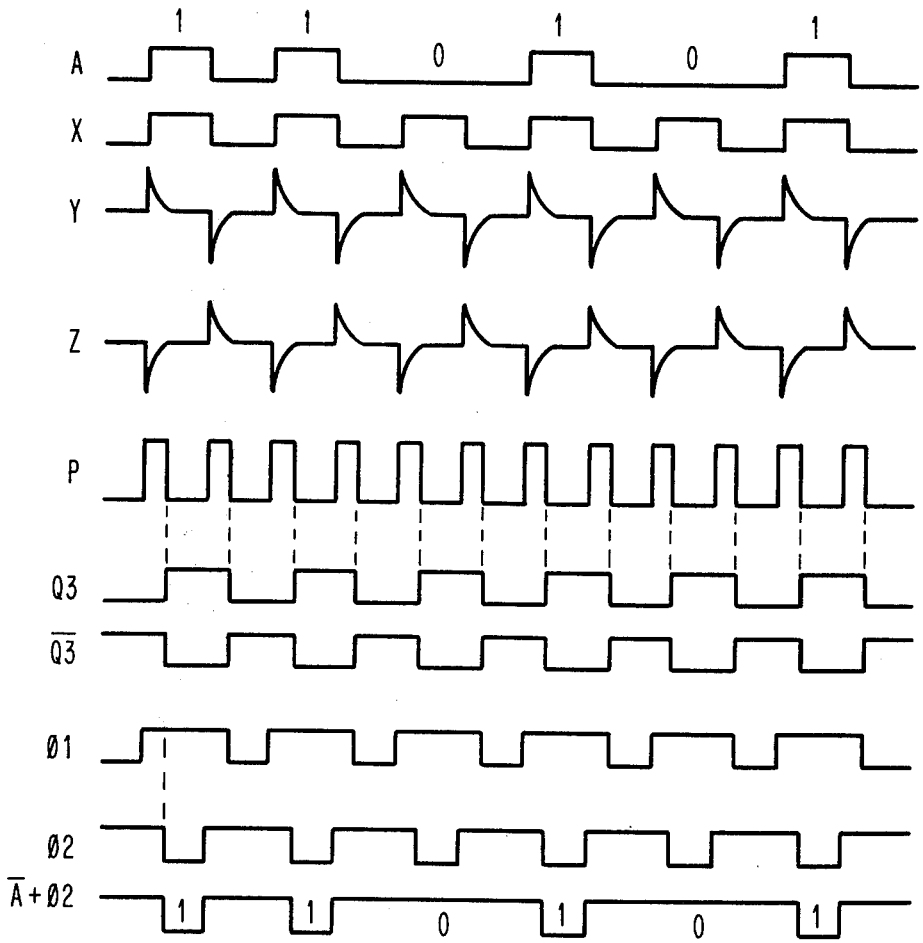

FIG. 16B illustrates waveform diagrams showing the operation of the circuit of FIG. 16A.

DETAILED DESCRIPTION

Figure 1:
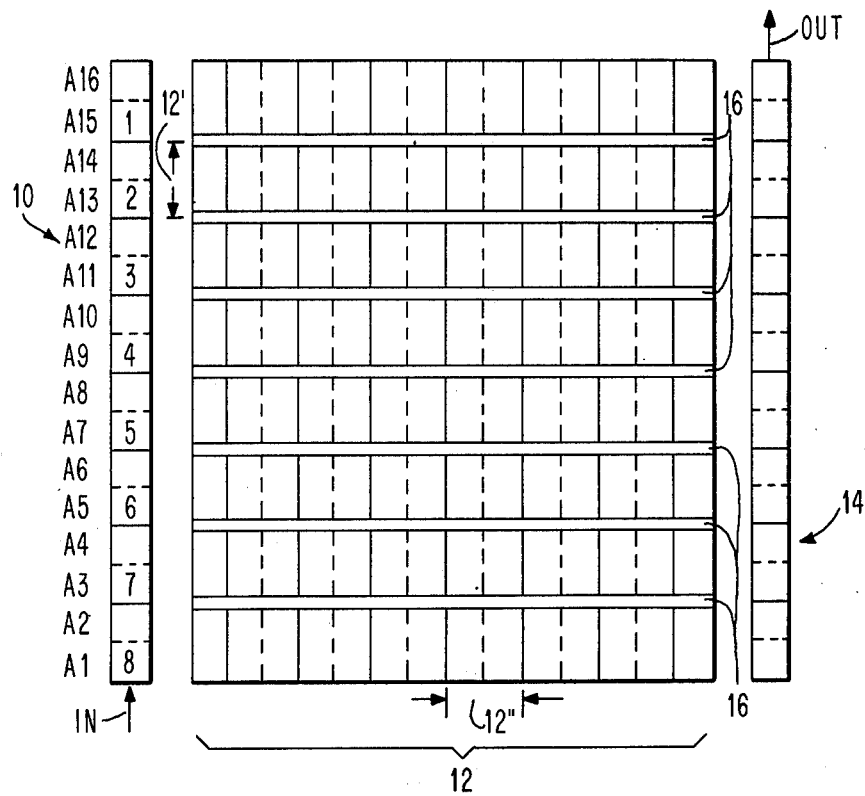
FIG. 1 is a schematic illustration of a serial-parallel-serial configuration without interlacing, as known in the prior art.

FIG. 1 illustrates a known type of serial-parallel-serial (SPS) memory structure essentially consisting of a serial input register 10, a parallel register 12, and a serial output register 14. Register 10 is illustrated with sixteen storage cells A1 through A16. Each storage cell is alternately required as a transfer site and a storage site. Thus, the first eight bits introduced in series would enter the input serial register 10 as shown. Once register 10 is full, the eight data bits are transferred in parallel to the first stage of parallel register 12. In this format, the bit width 12' of the parallel register 12 is equal to that of two storage cells consisting of the transfer site and the storage site in the serial register. The bit length 12'', however, is the same as in the serial register because parallel register 12 also requires both a transfer stage and a storage stage for each storage column. Data bits are transferred through the parallel register 12 until finally transferred in parallel into output serial register 14. Data bits are then transferred in a serial fashion out of register 14 and further amplified and transmitted either to a utilization device or recirculated to the input. Data bits in the parallel register 12 are prevented from interfering with each other by the use of channel stop regions 16.

It is noted that the bit width 12' is approximately twice what is needed for the transfer of charge through parallel register 12. Accordingly, it was noted in the prior art that by transferring into the parallel register 12 from both the transfer site and the storage site of each of the storage cells A1 through A16 in input register 10, the bit density of parallel register 12 could be substantially increased. An additional channel stop region 16 would be required to separate the additional data bit streams. (Alternatively, eight bits could be transferred through a parallel register having only half the bit width.) In order to implement such a "double dense" or "interlaced" configuration, additional clock controls requiring additional chip metallurgy area, etc. were required. The fewer the additional clocks, etc. the closer one could approach the ideal limit of doubling the density of a serial-parallel-serial configuration.

Figure 2:
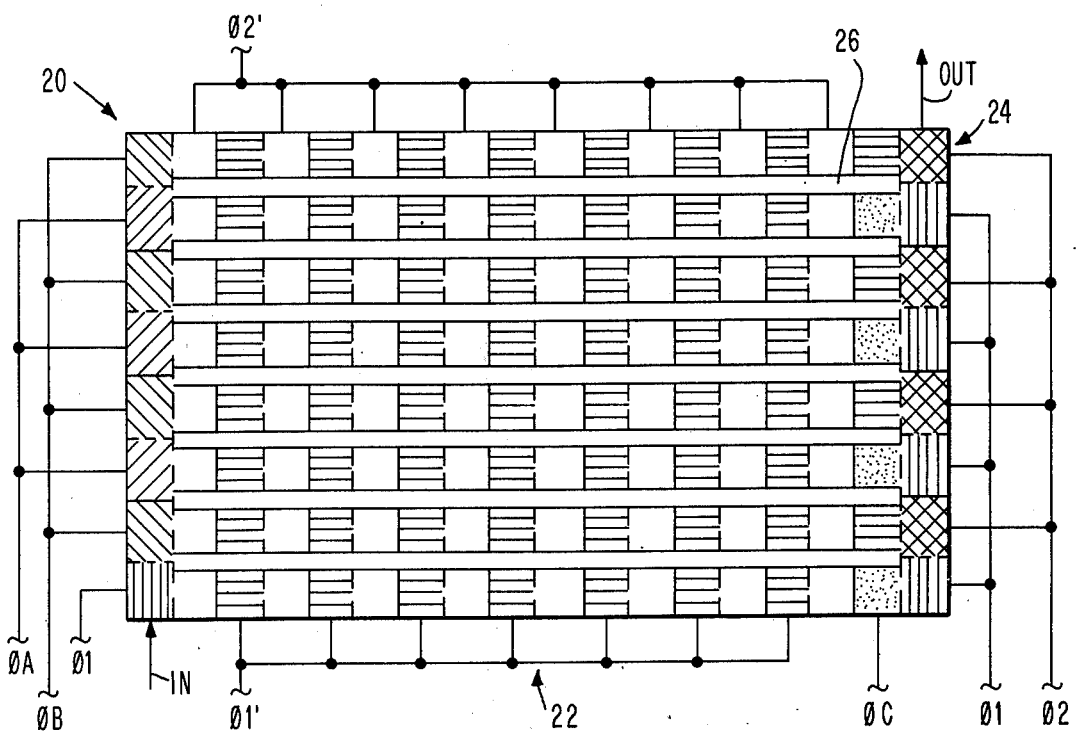
FIG. 2 is a schematic representation of an 8 × 8 interlaced serial-parallel-serial CCD shift register with the seven clock pulses applied in accordance with the present invention.

Refer now to FIG. 2 which schematically illustrates a structure of the present invention. Basically, a serial bit stream is inputted into serial register 20. For purposes of illustration, a serial input register 20 having eight storage cells (four storage sites and four transfer sites) is illustrated although it is obvious that the concept could be expanded to any desired length of serial register. It is further pointed out that for the purposes of the present invention, there is no structural distinction between storage sites and transfer sites. What is significant is that there can only be a bit stored in alternate sites so that if a bit is stored in a storage site, then the transfer sites immediately preceeding and immediately following the storage site must be empty for the successful propagation of a bit stream. Storage sites and transfer sites can be generically referred to as storage cells. As illustrated, register 20 is a two phase serial CCD shift register. A first clock pulse phase 1 (Ø1) controls the input of a first bit into the first storage site. Second and third clock pulses, phase A (ØA) and phase B (ØB), are connected to alternate stages of the remainder of the serial register 20 for serially transferring data bits to alternate ones of the eight storage cells until four data bits are stored in the serial input stage.

Parallel register 22 having the same number of rows as there are storage cells in serial register 20, then receives the four data bits in parallel. In the illustrated embodiment, eight columns of data can be stored at one time, each column of data requiring a column of storage sites and a column of transfer sites. These columns of data are normally propagated in parallel under the control of a fourth clock pulse (Ø1') and a fifth clock pulse (Ø2'). The first four bits of data are transferred to the second half of the first column which is under the control of the clock pulse phase 1' and are held there until the second four bits of data can be read into the serial register and transferred in parallel to the remaining four storage sites. Thus, eight bits of data can be propagated through parallel register 22 under the control of the clock pulses phase 1' and phase 2'.

After the data bits have been propagated in parallel through the entire register 22, they are read into serial output register 24, four bits at a time under the control of a sixth clock pulse phase C (ØC). The serial output of register 24 is under the control of a seventh clock pulse phase 2 (Ø2) and the first clock pulse phase 1. By utilizing the first clock pulse phase 1 in the output register, the need for an eighth clock is eliminated. Furthermore, when it is desired to recirculate the output of register 24 into the input of register 20, the use of clock pulse phase 1 at both the output and input assures that such transfer will take place synchronously. A channel stop 26 prevents cross talk between channels in array 22.

Figure 3A:
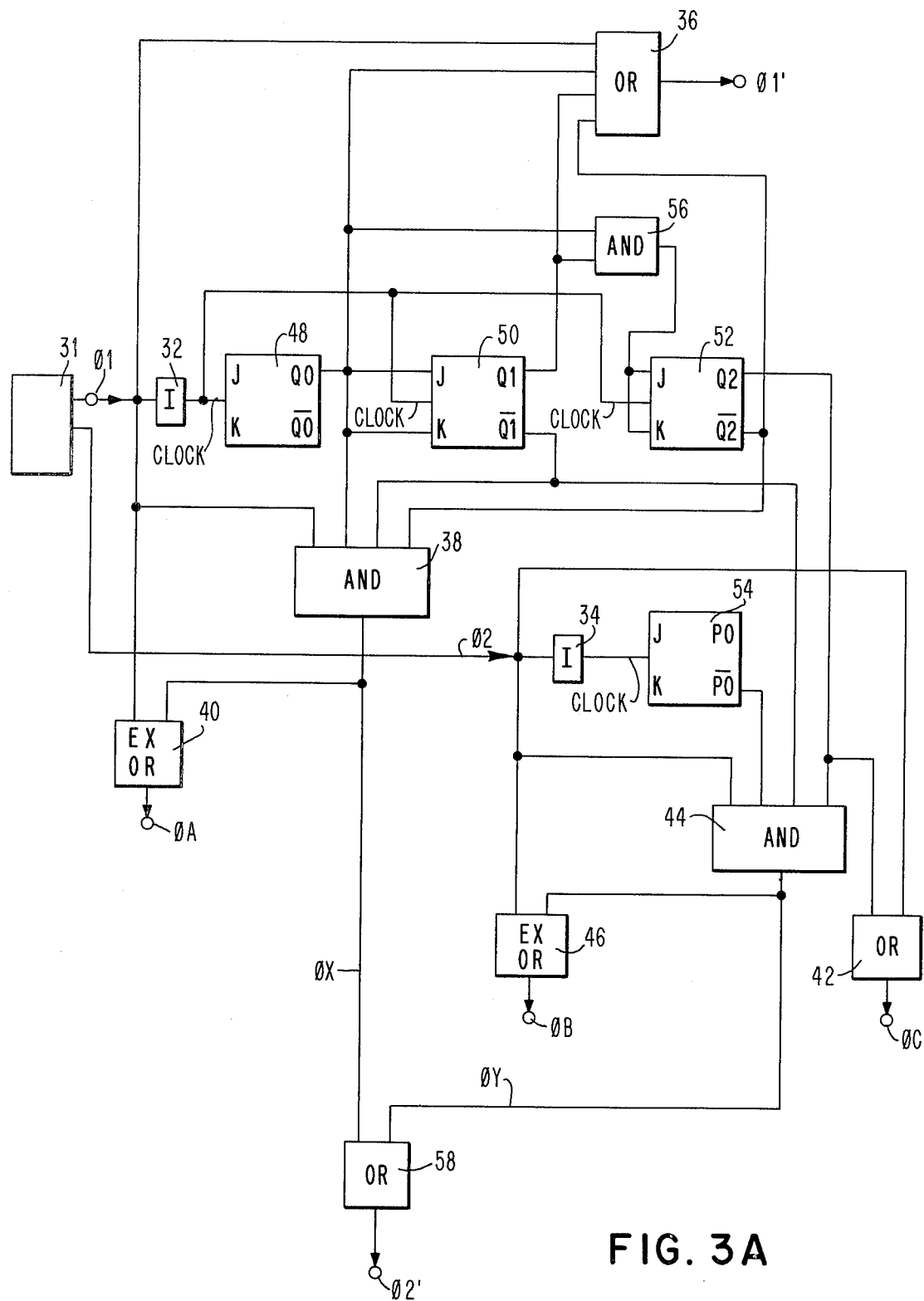
FIG. 3A is a logic circuit illustrating the generation of the seven clock pulses.
Figure 3B:
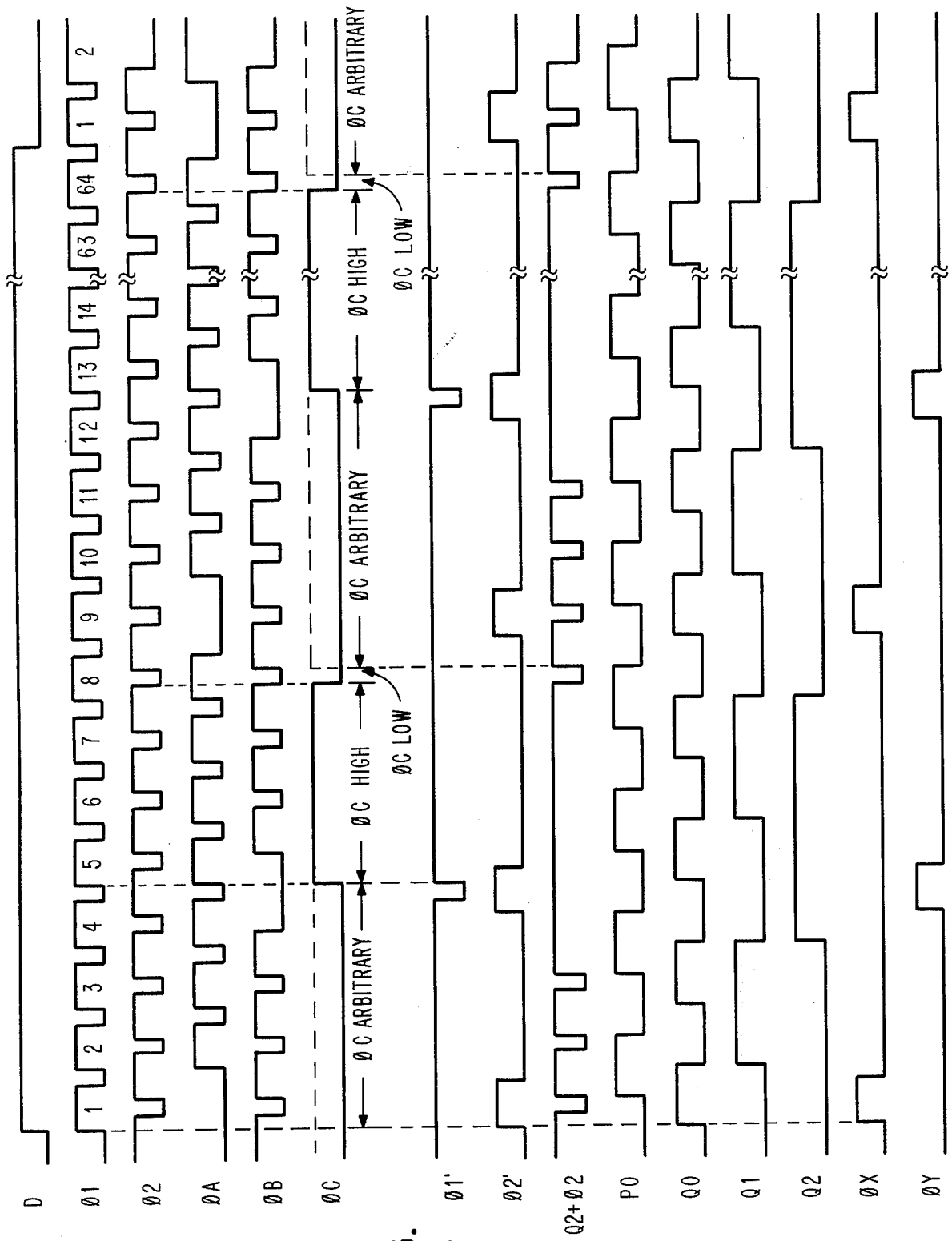
FIG. 3B illustrates waveform diagrams.

Refer now to FIG. 3A for an exemplary logic circuit for the generation of the clock pulses illustrated in FIG. 3B. The relationship of clock pulses illustrated in FIG. 3B is required for the desired operation of the present interlaced SPS CCD memory. Those skilled in the art will recognize that once the desired waveform relationships are known, it is within the skill of the calling to generate such waveforms.

In the circuit shown in FIG. 3A, clock pulse generator 31 provides the phase 1 and phase 2 clock pulses to inverters 32 and 34 respectively. The phase 1 clock pulse is also supplied as an input to OR circuit 36, AND circuit 38, and exclusive-OR circuit 40. The phase 2 clock pulse input is further supplied to OR circuit 42, AND circuit 44, and exclusive-OR circuit 46. Circuits 48, 50, 52, and 54 are master slave JK flip-flops having both true and complement outputs with structure and operation well known in the art. The J and K inputs of 48 and 54 are maintained at the up logic level (+V). The output of inverter 32 is provided as a clock input to flip-flops 48, 50, and 52. The output of inverter 34 is provided as a clock input to flip-flop 54. The in phase output (Q0) of flip-flop 48 is supplied as an input to OR circuit 36, AND circuit 38, the J input to flip-flop 50, and an input to AND circuit 56. The in phase output (Q1) of flip-flop 50 is provided as an input to OR circuit 36 and AND circuit 56. The out of phase output ($\overline{Q1}$) of flip-flop 50 is provided as an input to AND circuit 38 and AND circuit 44. The in phase output (Q2) of flip-flop 52 is supplied as an input to OR circuit 42 and AND circuit 44. The out of phase output ($\overline{Q2}$) of flip-flop 52 is supplied as an input to AND circuit 38 and to OR circuit 36. The out of phase output ($\overline{P0}$) of flip-flop 54 is supplied as an input to AND circuit 44. The output of AND circuit 56 is supplied as an input to both the J and K inputs of flip-flop 52. The output of AND circuit 44 is provided as an input to exclusive-OR circuit 46 and OR circuit 58. The output of AND circuit 38 is provided as an input to exclusive-OR circuit 40 and to OR circuit 58. With this arrangement, the phase A output is provided by exclusive-OR 40, the phase B output is provided by exclusive-OR 46, the phase C output is provided by OR circuit 42, the phase 1' clock signal is provided by OR circuit 36, and the phase 2' clock pulse is provided at the output of OR circuit 58.

Figure 4:
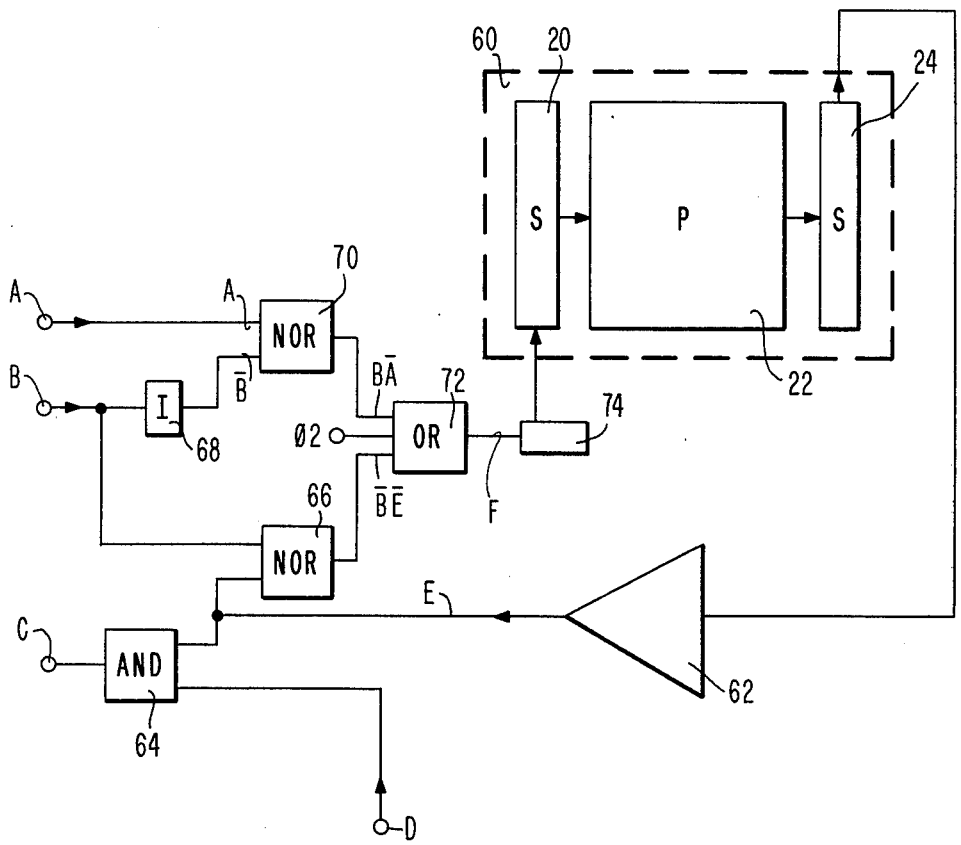
FIG. 4 is a logic diagram illustrating support circuits.

Refer now to FIG. 4 for a description of the supporting logic circuits for the overall operation of the interlaced SPS CCD memory. Memory 60 is illustrated within dotted lines and includes input register 20, parallel register 22 and output serial register 24. The output of serial resister 24 is typically applied to an amplifier 62. Amplifiers used in the detection of CCD output stages are well known. The output of amplifier 62 is provided on line E and may be read out at terminal C through AND circuit 64 when AND circuit 64 simultaneously receives a read enable pulse at terminal D as illustrated by waveform D in FIG. 3B. The data on line E may also be recirculated through NOR circuit 66 when write command B (which forms a second input to NOR circuit 66) is at a down level. When write command B is at an up level, and provided to inverter 68, then a down level signal is applied to NOR circuit 70 permitting $\overline{A}$, the complement of new data A (which is a second input to NOR circuit 70) to be applied as one of the three inputs to OR circuit 72. The output of OR circuit 72 at line F is Ø2 OR-ed with the complement of either the new data received on terminal A or the recirculated data from line E depending on whether or not the logic input at terminal B is at an up or down level. As has been stated, if the logic input at terminal B is at an up level, then the complement of the new data from terminal A is to be OR-ed with Ø2 and is presented on line F while if the input terminal B is at a down level, then the complement of the recirculated data from line E is OR-ed with Ø2 and is presented on line F. The data bit on line F is applied to the input device 74 as an input to the serial register 20.

Refer now to FIG. 5 which is a top view of a portion of memory 60 implemented on a semiconductor chip. Specifically illustrated are the input devices 74 and portions of register 20 and 22 nearest the input. From this top view, the relationship of the clock phase lines becomes apparent. Both highly doped polycrystalline material as well as metal are used for the conductive lines. Also, two different levels of polycrystalline material referred to a poly 1 and poly 2 are used, as will become more apparent from the vertical cross sections. Thus, the poly 2 regions include the input line, and the phase B clock line. The phase 2' clock line is poly 1. Metal lines provide the VDC line associated with input device 74, and connect the phase A, phase 1, and phase 1' clock lines. In serial register 20, data bits inputted at input device 74 are propagated upwards by the alternate arrangement of the phase 1, phase B, phase A, phase B, etc. alternating lines. Parallel transfer from left to right is under the control of the alternating phase 2' and phase 1' lines. Data integrity in the various channels in the parallel register is maintained by the isolation provided by channel stop regions 26.

The structural arrangement becomes clearer by referring to FIG. 5A which is a vertical section along section line AA. The semiconductor substrate usually P-type silicon has a number of N-type doped regions in order to provide directionality to the illustrated two phase shift register. Such N-type regions are usually formed by ion implantation. In the illustration, the width of the N-type implant is greater than the length. For this reason, the implant under the phase 1 metal line of the input register is seen in the direction of propagation, while the implant under a portion of the phase 2' poly 1 line is shown perpendicular to the direction of propagation. It is also well known that directionality in two phase shift registers can also be obtained by other forms of structural asymmetry such as an off-set gate configuration, for example.

Also, note the dielectric insulating material between the various clock lines and the top surface of the semiconductor substrate. The insulating material is usually silicon dioxide although other types of dielectric material are well known. The oxide is thick in those places where it is desired for the clock line not to have an effect on the charge in the underlying substrate, as for example in the left most portion of FIG. 5A. In other places, however, such as illustrated between the phase 1 metal line and the N-type implant therebeneath, a thin oxide layer is interposed so that charge can be propagated in accordance with well known CCD techniques. With respect to the implant under the phase 2' poly 1 line, note that the implant occurs only under a portion of the phase 2' line resulting in a left to right directionality. Similarly, under the phase 1' metal line, an implant occurs only under the right hand portion of the conductor as partially seen in FIG. 5A.

Refer now to FIG. 5B which shows a vertical section along section line BB of FIG. 5. In this next storage cell of serial input register 20, the phase B poly 2 line has replaced the phase 1 metal line of FIG. 5A. With respect to the parallel transfer, however, the same phase 2' and phase 1' lines described with respect to 5A are also illustrated in FIG. 5B. Similarly, the same phase 2' and phase 1' lines are seen in FIG. 5C which is a vertical section along section line CC in FIG. 5. The new feature illustrated in FIG. 5C is that metal line phase A is the next storage cell in the serial input register 20.

Refer now to FIG. 6 which is another vertical section. Specifically illustrated in the left most portion is the input device including a VDC metal line connected to a deep N-type diffusion in substrate 20. Also illustrated are the poly 2 lines for the input electrode and phase B as well as the metal lines for the phase 1 and phase A clocks. As illustrated, this FIG. 6 section shows a portion of the input serial register. Aside from the input device structure, per se, the remainder of this register is a standard 2 phase CCD and is therefore generically also illustrative of the output serial register as well as each of the channels in the parallel array.

Refer now to FIG. 7 which is a top view of a portion of the output serial register and the portion of the parallel array adjacent thereto. The phase 1' line is metal and the phase 2' line is poly 1 since this portion of the parallel array is merely the conclusion of the same group of registers initially shown in FIG. 5. The serial output register is controlled by the alternate phase 1 metal and phase 2 poly 1 lines. In order to permit only half the data bits in the last column of the parallel array to be transferred into the output serial register at one time, a phase C clock line consisting of poly 2 is also provided. The poly 2 line distributing the phase C clock goes to every alternate storage cell in the column. Channels are separated by the same channel stop illustrated in FIG. 5 which can be thick oxide regions 26 which prevent charge transfer from one parallel channel to the other.

Refer now to FIG. 7A which is a vertical section along section line AA in FIG. 7. The phase 2' poly 1 overlies the memory cell in the first stage of the last column of the parallel array while the phase 1' metal overlies the memory cell in the second stage of the last column of the parallel array. The phase C poly 2 overlies the phase 2' poly 1 and has no effect on charge transfer at the point of illustration. Transfer out of the parallel array in FIG. 7A into the serial output stage is under the control of the phase 1' metal line and the phase 2 poly 1 line which forms part of the serial output register.

FIG. 7B is a vertical section along line BB of FIG. 7 and illustrates the alternate storage cell in the last column of the parallel array. Here the phase C poly 2 line underlies the phase 1' metal line so that output from left to right takes place under the control of the phase C clock line and the phase 1 clock metal line. The phase 1 metal line is part of the output serial register.

Refer now to FIG. 16A which illustrates in greater detail two phase clock generators 31 of FIG. 3A. Input terminal X receiving a square wave clock input pulse of desired frequency and synchronized with the train of voltage pulses representing the data input A is applied to capacitor C1 and the input of inverter 80 which has its output connected to capacitor C2. The other plate of capacitor C1 is connected to input Y of NAND circuit 82 while the other plate of capacitor C2 is connected to the Z input of NAND circuit 82. Each of the these inputs is biased to a logic up level by connection to the +V terminal by means of resistors R1 and R2, as shown. The output of NAND circuit 82 is provided as an input to both OR circuit 84 and OR circuit 86. The output of NAND circuit 82 at node P is also applied as a clock input to JK flip-flop 88. The J and K inputs of flip-flop 88 are held at a logic up level and are shown connected to terminal +V. The in phase output (Q3) and out of phase output ($\overline{Q3}$) of flip-flop 88 are applied as second inputs to OR circuits 84 and 86, respectively. The phase 1 and phase 2 clock outputs are provided by OR circuit 84 and OR circuit 86 respectively.

OPERATION

The operation can be best understood by an example of a 64 bit interlaced serial-parallel-serial memory. For a CCD memory, there are three modes of operation: write, read, and recirculation modes. Considering first the write mode of operation, refer to FIGS. 5, 6, and 6A–6C. Data appears as a continuous serial bit stream applied at the gate of an input device of the type illustrated in FIGS. 5 and 6. The input gate (poly 2 in FIG. 6) is initially set at a high potential and VDC is properly adjusted such that charge fills the region below it as shown in FIG. 6A. When the input bit is a logical 1, the input gate is pulsed low while ØB is low causing charge $Q_{in}$ to be inserted in the storage well under electrode Ø1 as shown in FIGS. 6B and 6C. If the input bit is a logical 0, the input gate remains at the high potential; therefore, no charge will be filled under the Ø1 electrode. Thus, through the input device, the input data are converted into the form of charge packets if the data are of logic "1" level and no charge packet is produced if the data are of logic "0".

As further illustrated in FIGS. 8A and 8B input data are shifted one bit at a time into the first storage cell of the input serial register 20 under the control of the phase one clock pulse. Subsequent data shifting through the input register 20 is under the control of the phase A and phase B clock pulses. For purpose of description, storage cells will be referred to by the particular clock pulses to which they are connected. Thus, at time equals "T0", the phase 1 clock pulse moves to an up level permitting bit one to be shifted into the phase one cell of register 20. Subsequently, the phase B pulse is raised to an up level forming a potential well at the first phase B storage site in register 20. As soon as the phase 1 pulse is returned to a down level (at time T0'), the electron charge packet (in case a logical "1" was inserted) is pushed into the first phase B storage site of register 20. This is a push-clock type of charge transfer well known in the art. Subsequently, the phase A clock pulse moves to an up level creating a potential well in the third storage cell of input register 20 and the data bit is received into this third storage well as soon as the phase B clock goes to a down level. In this manner, at time equals T1, the first four bits are in the storage cells noted in FIG. 8A.

Next, the phase 2' clock is raised to an up level causing a potential well to be formed in the first stage of the first column of the parallel array 22. The phase 1 and phase A clock pulses are brought to a down level pushing the first four bits into the first column of the parallel array at time T2. Since the phase B clock was already at a down level, the data bits are prevented from being pushed into the phase B memory cell locations.

Refer now to FIGS. 9A and 9B for a description of the bit positions at time equals T3. The phase 1' clock pulse is brought to an up level creating a potential well in the second stage of the first column of the parallel array 22. When the phase 2' time clock is brought to a down level, the first four data bits are pushed into this second stage of the first column. The bits cannot be pushed back into serial register 20 because of the structural asymmetry inherent in a two phase shift register. Also at time equals T3, phase 1 had been brought to an up level creating a potential well in the first cell position of serial register 20 and the fifth bit was pushed into this position.

Refer now to the FIGS. 10A and 10B which describe the operation of the shift register through time equals T4. During this interval, phase 1' is maintained at an up level and phase 2' is maintained at a down level so that the first four bits are stayed in the second stage of the first column of the parallel register 22. At the same time, the phase 1, phase A and phase B clock pulses bring bits 5 through 8 into the phase B bit positions of input register 20. Thus, at time equals T4 the condition illustrated in FIG. 10A prevails.

Refer now to FIGS. 11A and 11B for the operation of the CCD memory at time equals T5. Phase 2' is brought to an up level creating a potential well in the first stage of the first column of the parallel register and upon the down level occurrence of the phase B clock pulse, bits 5 through 8 are transferred into the first stage of the first column of the parallel register. At the same time, the up level of phase 1 creates a potential well so that bit number 9 is pushed into the first storage cell of register 20.

Refer now to FIGS. 12A and 12B for a description of the operation of the CCD memory at time equals T6. Phase 1' is maintained at an up level continuing to hold a potential well in the second stage of the first column of the parallel register 22. Upon the down going transition of phase 2', bits 5 through 8 are pushed into the second stage of the first column of parallel register 22. At the same time, the up level of the phase B pulse creates a potential well while the down level of the phase 1 clock pushes bit 9 into the second storage cell of serial register 20. This completes the interlacing of the first eight bits. In subsequent operations, these eight bits are shifted in parallel through register 22 as the next eight bits become interlaced in the second column of parallel register 22 in the identical manner.

Refer now to FIGS. 13A and 13B. Note that each set of eight bits has been transferred in parallel until just before time equals T7, the first eight bits have reached the second stage of the last column in the parallel register. At time equals T7, phase 1 is brought to an up level creating potential wells at the phase 1 storage cells of output serial register 24. Upon the occurrence (at time equals T7) of the down level of the phase C clock pulse, these first four bits are pushed into the output serial register 24 as shown in FIG. 13A. The phase 1' pulse, however, is maintained at an up level, keeping bits 5 through 8 in the second stage of the last column of the parallel register 22.

Refer now to FIGS. 14A and 14B for a further description of the operation, particularly the outputting of the serial data bit stream. After the 64th bit has been inserted into the phase 1 memory cell of the input shift register, the phase 1 pulse is brought to a down level. Since the phase 1 clock pulse is connected to both the input and output serial registers, the down level of the phase 1 pulse not only causes bit number 64 to be pushed into the second storage cell of register 20 but the first four bits 1-4 in the output register are transferred from the phase 1 storage cells to the phase 2 storage cells.

As illustrated in FIGS. 15A and 15B, the phase 1 and phase 2 clocks continue to shift the first four data bits out of register 24. Amplifier 27 in FIG. 15A illustrates how during time equals T9 the first bit is amplified by amplifier 27 and recirculated into the phase 1 bit position of register 20. Thus, while the first four bits 1-4 are being shifted out of register 24 by phase clocks phase 1 and phase 2, the same bits are inserted into input serial register 20 by phase clocks phase 1, phase A, and phase B. During this time, the phase 1' clock is maintained at an up level to assure that data bits 5, 6, 7, and 8 remain in the second stage of the last column of register 22.

It is noted that phase clock C has a "don't care" condition during the same time so that it can be at an up or down level without affecting operation. This flexibility can simplify the generation of the phase C clock pulse. After the first four bits have been shifted out of register 24, the phase 2 clock is again held at an up level creating a potential well in the serial output register 24 for bits 5, 6, 7, and 8; these bits being shifted into register 24 as soon as the phase 1' clock pulse goes to a down level. It is, of course, apparent that at the same time that bits 5-8 are shifted to the output register 24, the phase 1' and phase 2' clocks have also shifted all the columns in the parallel register 22. Thus, as soon as bits 5–8 have been shifted out of serial output register 24, bits 9–12 are shifted into output register 24. It is apparent that from this point in time, the just described waveforms and data bit operations continue with the interlaced serial-parallel-serial transfer operations.

For a further detailed description of the overall operation of the interlaced SPS memory, refer now to FIG. 4. Assume first a read or data regeneration mode of operation which are both started by sensing the output of register 24 by amplifier 62. If a charge packet in the output cell of the output registers is detected, a positive voltage pulse will be generated by the amplifier 62. Thus, by connecting the output of amplifier 62 to the input device 74, a full amount of electron charge will be generated to replenish the charge lost during the transfer through the SPS register. No voltage pulse and therefore zero charge will be regenerated if a very small amount of charge corresponding to a fat zero or the back ground noise is sensed by amplifier 62. In the exemplary system of FIG. 4, the amplifier 62 output is shown connected to line E which in turn is connected to the input of both AND circuit 64 and NOR circuit 66. If AND gate 64 is conditioned by a read enable pulse at terminal D, then the output is obtained at terminal C. This completes a read operation.

For a regeneration cycle, however, the NOR gate 66 must be conditioned by a write command (down level) at terminal B causing the recirculated data to be presented at line F to the input device 74. In order to write new data to the memory, the write command signal B is brought to an up level, inhibiting NOR circuit 66 but permitting data on input terminal A to be transferred to line F, into input device 74 and thus into the first stage of the serial register 20. It should here be noted that input device 74 is a standard input means known in the art as illustrated for example by the input device in FIGS. 5 and 6. Thus, inputting data into input device 74 is the same as inputting it into the phase 1 memory cell in the input register 20. It is further known that output register 24 requires an output device for connecting the charge output to the input of amplifier 62 and such an output device is not separately shown. It is further known that the speed of operation of a charge coupled device memory is much slower than the speed of support circuits such as amplifier 62 and logic devices 64–72. In the present example, it has therefore been assumed that the output of register 24 can be recirculated to the input device of register 20 with negligible delay so that a continuous bit stream can be recirculated. From the foregoing, it is also clear that the timing sequence of a recirculation mode is identical to that of the write cycle. Recirculation is merely a special case in which the data to be written comes from the last memory cell in output register 24.

The foregoing exemplary operation can be enhanced or adapted to various specialized techniques as desired. For example, data readout can be either of block readout or of random data access. If it is desired to read the whole block of data from memory, then the read operation must start when the first data bit has arrived at the last memory cell of the output register 24. To accomplish this merely requires an address counter for address synchronization. If random data access should be an added feature of the memory, then in addition to the address counter an address comparator is needed to locate the precise desired address. These and other techniques applicable to CCD memories in general are readily applicable to the memory of the present invention.

The foregoing describes in detail the operation of the interlaced SPS CCD memory of the present invention in accordance with the illustrated clock phase pulses. Once such waveforms and their relationship to the herein disclosed memory array have been described, different techniques for generating these waveforms will occur to those skilled in the art. As previously mentioned, a key feature is that the interlaced SPS function is performed with only seven clock pulses.

Our preferred circuit for generating the waveforms illustrated in FIG. 3B is by means of the logic circuit illustrated in FIG. 3A. The phase 1 and phase 2 pulses are out of phase waveforms provided by clock pulse generator 31. These are the highest frequencies in the charge transfer portion of the CCD memory and all other waveforms are derivable therefrom. In order to generate the phase A pulse, exclusive OR circuit 40 receives both the phase 1 input and the output of AND circuit 38. The output (ØX) of AND circuit 38 is a string of voltage pulses which appears once every beginning of an eight bit cycle. Thus, every eighth bit the phase A pulse is maintained at a down level whereas otherwise it is identical to the phase 1 pulse. In order to obtain one out of every eight pulses from AND circuit 38, four inputs to AND circuit 38 are provided. JK flip-flop 48 provides an in phase output Q0, while JK flip-flops 50 and 52 provide out of phase outputs (Q1 and Q2) to AND circuit 38, the foregoing three input signals being ANDed with the phase 1 pulse. An up level output is simultaneously received from each of the flip-flops 48, 50, and 52, once in every eight phase 1 pulses resulting in the desired output from AND circuit 38. When both inputs to exclusive-OR circuit 40 are at an up level, phase A is maintained at a down level. At all other times, the output of the AND circuit is at a down level so that the phase 1 pulse is passed through exclusive-OR circuit 40.

It is noted that the phase B pulse is quite similar to the phase A pulse except for the phase. Thus, the phase B pulse is identical to the phase 2 pulse except that once in every eight bits, the phase B pulse is blocked. For this reason, the phase B pulse is obtainable from exclusive-OR circuit 46 in a manner similar to the obtaining of the phase A pulse from exclusive-OR circuit 40. AND circuit 44 receives an input from JK flip-flops 50, 52, and 54 and these three signals are ANDed with the phase 2 clock input. When all four inputs are up, AND circuit 44 provides an output (ØY) once in every eight cycles. Thus, once in every eight cycles the exclusive-OR circuit 46 inhibits the passage of the phase 2 clock pulse causing phase B to remain at a down level for that particular bit position.

The output of OR circuit 36 provides the phase 1' clock pulse. Thus, phase 1' will be at an up level when either phase 1 or the indicated output of any one of JK flip-flops 48, 50, or 52 is at an up level. Thus, all of the indicated flip-flops simultaneously have a down level output at the indicated terminal once every eight bits. The first time this occurs is at the beginning of the fourth bit. Accordingly, after the fourth bit phase 1 pulse goes to a down level, the output of OR circuit 36 is at a down level and the phase 1' clock pulse is generated.

The phase 2' clock pulse is obtained from OR circuit 58 which receives the output of AND circuit 38 and AND circuit 44. As previously mentioned, AND circuit 38 provides an up level output (∅X) every eighth bit position. Similarly, AND circuit 44 provides an up level output (∅Y) every eighth bit position, but out of phase with the once every eighth bit output of AND circuit 38. By logically ORing these two signals, an up level signal is obtained once in every four bits, as shown in FIG. 3B.

As previously mentioned, there is some flexibility in the generation of the phase C clock pulse. The phase C clock pulse illustrated in FIG. 3B is idealized for purposes of simplifying the explanation. The waveform illustrated as phase C is obtainable with simple logic circuits. However, it is even simpler to use as the phase C clock signal the output of OR circuit 42 which provides the logical sum of the phase 2 and Q2 clock pulses. This produces a waveform as illustrated in FIG. 3B which produces high and low phase C clock pulses when required. It is noted that during the time indicated as being arbitrary, different levels are obtained than those indicated in the idealized clock pulse waveform phase C. Nevertheless as long as the phase C clock pulse is at an up or down level at the critical intervals, the levels at other times do not affect the operation.

The results given above can be easily generalized for the case that the bit number of the input register is of module 2. Thus, for an interlaced SPS memory designed with $2^n$ bit, serial registers, the clock pulses can be generated accordingly to the following logic equations:

$$\emptyset A = \emptyset 1 \oplus \emptyset X = \overline{\emptyset 1}\emptyset X + \overline{\emptyset 1}\, \emptyset X$$

$$\emptyset B = \emptyset 2 \oplus \emptyset Y = \emptyset 2 \overline{\emptyset Y} + \overline{\emptyset 2}\, \emptyset Y$$

$$\emptyset C = \emptyset 2 + Q2$$

$$\emptyset 1' = \emptyset 1 + (Q\emptyset + Q1 + Q2 + \ldots + Q_{n-2} + \overline{Q}_{n-1}),$$

$$\emptyset 2' = \emptyset X + \emptyset Y$$

where $$\emptyset X = (Q\emptyset \cdot \overline{Q1} \cdot \overline{Q2} \ldots \overline{Q}_{n-1}) \emptyset 1$$

$$\emptyset Y = (\overline{P\emptyset} \cdot \overline{Q1} \cdot \overline{Q2} \ldots \overline{Q}_{n-2} \cdot Q_{n-1}) \emptyset 2$$

P0 is the output of the JK flip-flop with $\overline{\emptyset 2}$ as the input and $Q_i$ ($i=0, 1, 2 \ldots n-1$) is the ith bit of the n-stage counter with ∅1 as the input.

For a detailed description of the generation of the phase 1 and phase 2 clock pulses, refer to FIGS. 16A and 16B. A symmetrical square wave input pulse at terminal X produces the illustrated transient signals at terminals Y and Z. Note that the square wave X is synchronized with the train of voltage pulse A representing the input data stream. Waveform A shows both "0" and "1" bits as part of an exemplary serial bit stream. Since these terminals are normally biased to an up level, the output of NAND circuit 82 on line P is usually at a down level and up level input transients on terminals Y and Z have no effect on the output. A down level transient at either terminal Y or terminal Z, however, produces a positive clock pulse at terminal P. This up level causes both OR circuit 84 and OR circuit 86 to have an up level output. Also, each time the signal on line P has a down going transition, Q3 and $\overline{Q3}$ change state as illustrated. The logical OR function of these signals produces the waveforms phase 1 and phase 2 which are essentially asymmetrical square waves out of phase with each other.

Charge transfer in two phase CCD shift registers is well known. For the sake of completeness, however, refer again to FIG. 6 and also to FIGS. 6A through 6G. Note that potential wells occur at four levels. Two discrete levels of potential wells are provided by the applied potentials. Additionally each of these applied potential levels create two discrete levels of wells by virtue of the built in structural asymmetry which in this case are the ion implants.

In FIG. 6A, a first condition is illustrated in which the metal lines phase 1 and phase A as well as poly 2 lines phase B are maintained at an up level. The metal line connected to the positive DC terminal (VDC) is always at an up level which, however, is higher than the up level that is applied to the phase 1 line. This is the condition at time $t(a)$ illustrated in FIG. 6G. The IN pulse is the input signal that appears on line F (FIG. 4), and has been OR gated with the phase 2 clock pulse, resulting in its illustrated phase relationship to the phase B clock pulse. Thus, at time $t(a)$, the input (IN terminal) poly 2 gate is always at an up level potential causing charge to fill the region beneath it, as illustrated in FIG. 6A.

Assume now, that the first input bit is a logical 1, as illustrated in FIGS. 6A–6G. Then, at time $t(b)$, the input gate and the phase B clock are brought to a down logic level. As specifically shown in FIG. 6B, excess charge is spilled out to the left, while the Q IN charge moves into the potential well created by the up voltage level at the phase 1 clock terminal. The Q IN charge settles under the phase 1 implant as illustrated in FIG. 6C. (Conversely, when the input bit is a logical 0, the input poly 2 gate remains at an up level potential so that charge originally stored there is not dumped under the phase 1 electrode.)

Continuing with the present example, in which charge was dumped under the phase 1 electrode, refer now to FIG. 6D, which depicts the potential waveform at time $t(d)$. At this point in time, all electrodes having waveforms shown in FIG. 6G are at an up level voltage. Next, at $t(e)$, the phase 1 clock is brought to a down level, pushing the input charge under the phase B implant, as shown in FIG. 6E. Next by returning phase 1 to an up level, at time $t'(a)$ as shown in FIG. 6F, the serial register is ready to receive the next input bit, as well as transferring the previously inputted data. The particular data bit stream illustrated in FIG. 6G is: 11010. Once inputted, data is transferred in the two phase mode by the phase A and phase B clock pulses. All charge transfer through both the serial registers as well as the parallel array is thus performed by alternating two clock pulses.

While the invention has been shown and particularly described with reference to a preferred embodiment, it will be understood by those skilled in the art that various changes in form and detail may be made therein without departing from the spirit and scope of the invention.

What is claimed is:

1. A two phase interlaced serial-parallel-serial memory comprising:
   a serial input stage having M storage cells, including an input storage cell forming a first one of said M storage cells for receiving a serial bit stream;
   a first clock pulse generator for providing a clock signal to said first storage cell permitting the transfer of data bits from said serial bit stream into and out of said first storage cell;

second and third clock pulse generators connected to alternate ones of the other of the M storage cells for serially transferring data bits to alternate ones of said other M storage cells until M/2 data bits are stored in said serial input stage at alternate storage cells;

a parallel storage array having M rows, corresponding to each one of said M storage cells in said serial input stage, and X columns, each one of said X columns having a first stage and a second stage, data being stored in only one of said two stages at all times;

a fourth clock pulse generator providing a clock signal to the second stage of each of the X columns with the exception of the second stage of the last one of the X columns where the fourth clock pulse generator is connected to only alternate storage cells at M/2 rows;

a fifth clock pulse generator for providing a clock signal to the first stage of each of the X columns, the first stage of the first column being directly coupled to said serial input stage;

a sixth clock pulse generator for providing a clock signal to those alternate storage cells in the second stage of the last one of the X columns corresponding to the M/2 rows not connected to the fourth clock pulse generator;

a serial output stage having M storage cells and directly coupled to the second stage of the last one of the X columns; and a seventh clock pulse generator for providing a clock signal to alternate ones of the M storage cells of the serial output stage, the other M/2 storage cells in the serial output stage being provided a clock signal by said first clock pulse generator.

2. A two phase interlaced serial-parallel-serial memory as in claim 1 further comprising:
amplifying means having an input electrically coupled to the last storage cell in said serial output stage, and having an output coupled to the input storage cell of said serial input stage thereby recirculating the data bits at the output of the output serial stage into the input of the serial input stage; whereby M × X data bits are stored.

3. A two phase interlaced serial-parallel-serial memory as in claim 2 further comprising:
logic circuit means connected between the output of said amplifying means and said input storage cell for synchronizing the occurrence of data bits at said input storage cell with clock signals from said seventh clock pulse generator.

4. A two phase interlaced serial-parallel-serial memory as in claim 3 wherein said logic circuit further comprises:
means for simultaneously recirculating and reading out data from the last storage cell in said output stage.

5. A two phase interlaced serial-parallel-serial memory as in claim 1 wherein:
the clock signal from the sixth clock pulse generator has significant intervals during which the potential level can be at either an up or down logic level without effecting the operation of the memory.

6. A two phase interlaced serial-parallel-serial memory as in claim 5 wherein said sixth clock pulse generator comprises:
an OR circuit and the clock signal provided by said sixth clock pulse generator is provided by the algebraic sum of the clock signal from said seventh clock pulse generator and another clock signal.

7. A two phase interlaced serial-parallel-serial memory as in claim 1 formed on an integrated circuit substrate wherein the distribution of said clock signals comprises:
first and second layers of polycrystalline conductors and one layer of metallic conductors.

8. A two phase interlaced serial-parallel-serial memory as in claim 7 wherein said input storage cell comprises:
a deep diffusion adapted to receive a steady state potential by means of a metal line.

9. A two phase interlaced serial-parallel-serial memory as in claim 7 wherein the clock signals from said first clock signal generator, said second clock signal generator, and said fourth clock signal generator are distributed by means of metallic conductors.

10. A two phase interlaced serial-parallel-serial memory as in claim 7 wherein all the storage cells are structurally asymmetric permitting only unidirectional charge transfer.

11. A two phase interlaced serial-parallel-serial memory as in claim 10 wherein said structural asymmetry is provided by selective ion implants.

12. A two phase interlaced serial-parallel-serial memory as in claim 1 wherein the last one of said M storage cells in said serial output stage is connected to the output of said seventh clock pulse generator.

* * * * *